United States Patent
Ji et al.

(10) Patent No.: US 11,320,879 B2
(45) Date of Patent: May 3, 2022

(54) POWER SUPPLY MODULE AND ELECTRONIC DEVICE

(71) Applicant: Delta Electronics (Shanghai) CO., LTD, Shanghai (CN)

(72) Inventors: Pengkai Ji, Shanghai (CN); Shouyu Hong, Shanghai (CN); Xiaoni Xin, Shanghai (CN); Zhenqing Zhao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 17/108,040

(22) Filed: Dec. 1, 2020

(65) Prior Publication Data

US 2021/0208649 A1    Jul. 8, 2021

(30) Foreign Application Priority Data

Jan. 8, 2020    (CN) .......................... 202010016898.7

(51) Int. Cl.
*G06F 1/26* (2006.01)
*H05K 1/14* (2006.01)
*H05K 7/20* (2006.01)

(52) U.S. Cl.
CPC ............. *G06F 1/263* (2013.01); *H05K 1/141* (2013.01); *H05K 7/209* (2013.01)

(58) Field of Classification Search
CPC ....... G06F 1/189; G06F 1/263; H05K 1/0262; H05K 1/141; H05K 3/301; H05K 7/209; H05K 3/303

(Continued)

(56) References Cited

U.S. PATENT DOCUMENTS 10,395,819 B2    8/2019    Wukovits et al.
2006/0181857 A1*    8/2006    Belady ................... H05K 1/141
                                                                    361/719

(Continued)

FOREIGN PATENT DOCUMENTS

CA        2647863 A1    7/2009
CN      101211792 A    7/2008

(Continued)

OTHER PUBLICATIONS

The 1st Office Action dated Sep. 23, 2021 for IN patent application No. 202034053622.

(Continued)

*Primary Examiner* — Levi Gannon
(74) *Attorney, Agent, or Firm* — Qinghong Xu

(57) ABSTRACT

The present disclosure provides a power supply module. The power supply module is applied to an integrated circuit chip assembly which includes a first carrier board and an integrated circuit chip located at a first side of the first carrier board; the power supply module includes: a second carrier board; a first-stage power supply unit; and a second-stage power supply unit, power input terminals of the second-stage power supply unit are electrically connected with corresponding power output terminals of the first-stage power supply unit through the second carrier board; power output terminals of the second-stage power supply unit are electrically connected with corresponding power terminals of the integrated circuit chip, a projection of the second-stage power supply unit on a first plane is at least partially located within a projection range of the integrated circuit chip on the first plane, the first plane is parallel to the first carrier board.

22 Claims, 47 Drawing Sheets

(58) Field of Classification Search
USPC .......................................................... 307/43
See application file for complete search history.

(56) References Cited

U.S. PATENT DOCUMENTS

| | | | |
|---|---|---|---|
| 2009/0296360 | A1 | 12/2009 | Doblar et al. |
| 2014/0133115 | A1* | 5/2014 | Iguchi ................. H05K 1/0243 |
| | | | 361/760 |
| 2017/0048963 | A1* | 2/2017 | Murakami ............. H05K 1/115 |
| 2018/0032117 | A1* | 2/2018 | Leigh ..................... G06F 1/3275 |
| 2018/0076718 | A1 | 3/2018 | Zeng et al. |
| 2019/0074771 | A1 | 3/2019 | Zeng et al. |
| 2019/0254166 | A1 | 8/2019 | Ji et al. |

FOREIGN PATENT DOCUMENTS

| | | |
|---|---|---|
| CN | 103730434 A | 4/2014 |
| CN | 103871716 A | 6/2014 |
| CN | 104112727 A | 10/2014 |
| CN | 105449987 A | 3/2016 |
| CN | 102648667 B | 9/2016 |
| CN | 106329930 A | 1/2017 |
| CN | 107154385 A | 9/2017 |
| CN | 206726916 U | 12/2017 |
| CN | 107545974 A | 1/2018 |
| CN | 108962556 A | 12/2018 |
| IN | 201914054517 A | 12/2019 |
| IN | 202014000536 A | 1/2020 |
| JP | H097862 A | 1/1997 |
| JP | 2019079943 A | 5/2019 |

OTHER PUBLICATIONS

The 1st Office Action dated Dec. 16, 2021 for IN patent application No. 202014054043.
The 1st Office Action dated Dec. 31, 2021 for CN patent application No. 202010018831.7.
The 1st office action dated Jan. 24, 2022 for CN patent application No. 202010018822.8.

* cited by examiner

POWER SUPPLY MODULE AND ELECTRONIC DEVICE

CROSS-REFERENCE TO RELATED APPLICATIONS

This application is based upon and claims priority to Chinese Patent Application No. 202010016898.7, filed on Jan. 8, 2020, the entire content of which is herein incorporated by reference for all purpose.

TECHNICAL FIELD

The present invention relates to the technical field of power electronics, in particular to a power supply module and an electronic device.

BACKGROUND

Functions of Smart Integrated Circuit (IC) chips used in data centers or intelligent terminals become more and more, and its power consumption is getting larger and larger, regardless of whether it is a Ball Grid Array (BGA) package or a connection with a socket, so it is necessary to provide a larger input current. At the same time, a demand for signal traces on a mainboard to counter interference is also increasing, and the electronic devices on the mainboard are also increasing. Therefore, how to make a power supply module take up less mainboard resource, minimizing interference to the smart IC and the signal traces on the mainboard, and taking into account various application requirements flexibly are new demands for Smart IC power supply modules. In traditional horizontal supply power scheme, the current transmission path is long, which is not conducive to the improvement of efficiency and dynamic performance of the power supply module, and occupies more mainboard resource, which is inconvenient to flexibly arrange other electronic devices on the mainboard. Moreover, the traditional horizontal supply power scheme often needs to pass through a region where the signal traces on the mainboard are located, which has a greater interference to the signal traces. A vertical supply power scheme which placing the power supply module under the smart IC is an optimized and efficient supply power solution. However, input current of the power supply module also needs to be horizontally transmitted through the system mainboard, so there still have the problems, such as interferences on the signal traces and low transmission efficiency.

There are problems that need to be solved, such as how to reduce occupation of trace space and surface space of the mainboard by the power supply module as much as possible, how to transmit power to the smart IC more efficiently, meanwhile reducing the interference to the signal transmission of the smart IC and reducing height of the power supply module in the vertical supply power scheme to better match space constraints near the system board under the smart IC.

SUMMARY

An objective of the present invention is to provide a power supply module and an electronic device, which can realize vertically supplying power while reducing occupation of mainboard space.

Other features and advantages of the present invention will become apparent from the following detailed description, or partly learned through the practice of the present invention.

According to a first aspect of the present invention, there is provided an power supply module, which is applied to an integrated circuit chip assembly, the integrated circuit chip assembly comprises an integrated circuit chip and a first carrier board, the integrated circuit chip is located at a first side of the first carrier board;

the power supply module includes:
a second carrier board:
a first-stage power supply unit; and
a second-stage power supply unit, each of one or more power input terminals of the second-stage power supply unit is electrically connected with a corresponding one of one or more power output terminals of the first-stage power supply unit through the second carrier board, respectively;
wherein, each of one or more power output terminals of the second-stage power supply unit is electrically connected with a corresponding one of one or more power terminals of the integrated circuit chip, and a projection of the second-stage power supply unit on a first plane is at least partially located within a projection range of the integrated circuit chip on the first plane, the first plane is parallel to the first carrier board.

Optionally, a projection of the power output terminals of the second-stage power supply unit on the first plane and a projection of the power terminals of the integrated circuit chip on the first plane have an overlapping region, and the second-stage power supply unit is located at a side close to the power terminals of the integrated circuit chip.

Optionally, one or more signal terminals of the integrated circuit chip and the power terminals of the integrated circuit chip both are drawn out from a side facing toward the first carrier board, and the signal terminals of the integrated circuit chip are located at a periphery of the power terminals of the integrated circuit chip;

the second carrier board is located at a second side of the first carrier board, and the second side of the first carrier board is set to be opposite to the first side of the first carrier board.

Optionally, the first-stage power supply unit is located at a side of the second carrier board facing away from the first carrier board, and the second-stage power supply unit is located at the side of the second carrier board facing away from the first carrier board.

Optionally, a plurality of power vias are provided in the second carrier board, and projections of the power output terminals of the second-stage power supply unit, the power vias in the second carrier board, and the power terminals of the integrated circuit chip on the first plane have an overlapping region.

Optionally, a plurality of power vias are provided in the second carrier board and one or more capacitors are buried between the power vias, and a positive end of each of the capacitors is electrically connected to a corresponding positive power output terminal of the second-stage power supply unit and a corresponding positive power terminal of the integrated circuit chip, and a negative end of each of the capacitors is electrically connected to a corresponding negative power output terminal of the second-stage power supply unit and a corresponding negative power terminal of the integrated circuit chip.

Optionally, one or more inductors are buried in the second carrier board, a winding of each of the inductors is perpendicular to the first plane, and one end of the winding is electrically connected to a corresponding power output terminal of the second-stage power supply unit, and the other end of the winding is electrically connected to a corresponding power terminal of the integrated circuit chip.

Optionally, the first-stage power supply unit is located between the second side of the first carrier board and the second carrier board, and the second-stage power supply unit is located between the second side of the first carrier board and the second carrier board.

Optionally, the second carrier board comprises a first sub-carrier board, a second sub-carrier board, and a third sub-carrier board, and the second sub-carrier board is located between the first sub-carrier board and the third sub-carrier board, and the second sub-carrier board is electrically connected with the first sub-carrier board and the third sub-carrier board respectively;

the first-stage power supply unit is located at a side of the first sub-carrier board facing away from the first carrier board, and the second-stage power supply unit is located at a side of the third sub-carrier board facing away from the first carrier board; or the second carrier board comprises a first sub-carrier board and a second sub-carrier board, and the first sub-carrier board is electrically connected with the second sub-carrier board, the first-stage power supply unit is located between the second side of the first carrier board and the first sub-carrier board, and the second-stage power supply unit is located at a side of the second sub-carrier board facing away from the first carrier board.

Optionally, the second carrier board, the first-stage power supply unit and the second-stage power supply unit form an integrated power supply module, and the integrated power supply module is located at the second side of the first carrier board.

Optionally, an isolation structure is provided between the second carrier board and the first carrier board, and a projection of the isolation structure on the first plane covers a projection of the signal terminals of the integrated circuit chip on the first plane:

the isolation structure is an insulating layer, a shielding layer or a recessed area provided on the second carrier board.

Optionally, the first carrier board is provided with an opening and the second-stage power supply unit is electrically connected with the integrated circuit chip through the opening of the first carrier board:

the first-stage power supply unit is located at a side of the second carrier board facing away from the first carrier board, and a projection of the first-stage power supply unit on the first plane and a projection of second-stage power supply unit on the first plane have an overlapping region.

Optionally, there are a plurality of first-stage power supply units in the power supply module and there are a plurality of second-stage power supply units in the power supply module, wherein the plurality of second-stage power supply units are connected in parallel:

a plurality of projections of the plurality of first-stage power supply units on the first plane are located on at least two sides of a whole projection of the plurality of second-stage power supply units on the first plane respectively;

a projection of the plurality of first-stage power supply unit on the first plane is at least partially located outside of the projection range of the integrated circuit chip on the first plane.

Optionally, there is no overlapping region between the projection of the second-stage power supply unit on the first plane and a projection of the second carrier board on the first plane.

Optionally, one or more signal terminals of the integrated circuit chip are drawn out from a side facing toward the first carrier board, and the power terminals of the integrated circuit chip are drawn out from a side facing away from the first carrier board:

the second carrier board is located at a side of the integrated circuit chip facing away from the first carrier board, and the second-stage power supply unit is located at a side of the integrated circuit chip facing away from the first carrier board.

Optionally, the second-stage power supply unit is located between the integrated circuit chip and the second carrier board, the first-stage power supply unit is located between the first side of the first carrier board and the second carrier board, or the first-stage power supply unit is located at a side of the second carrier board facing away from the first carrier board; or, the second-stage power supply unit is located at a side of the second carrier board facing away from the integrated circuit chip, the first-stage power supply unit is located at a side of the second carrier board facing away from the first carrier board, or the first-stage power supply unit is located between the first side of the first carrier board and the second carrier board.

Optionally, the integrated circuit chip comprises a bare chip, an insulating packaging material, and a packaging substrate, the bare chip is buried in the insulating packaging material, and the packaging substrate is located between the insulating packaging material and the first carrier board, the signal terminals of the integrated circuit chip are drawn out from a side of the packaging substrate facing toward the first carrier board, and the power terminals of the integrated circuit chip are drawn out from a side of the insulating packaging material facing away from the first carrier board; or, the integrated circuit chip comprises a bare chip and a package substrate, and the package substrate is located between the bare chip and the first carrier board, the signal terminals of the integrated circuit chip are drawn out from a side of the packaging substrate facing toward the first carrier board, and the power terminals of the integrated circuit chip are drawn out from a side of the packaging substrate facing away from the first carrier board.

Optionally, the power supply module further comprises a heat sink, and the heat sink is fixed to the second carrier board by a fastener.

Optionally, signal traces of the first-stage power supply unit are electrically connected with signal traces of the first carrier board:

the power input terminals of the first-stage power supply unit are electrically connected to the first carrier board, or, the power supply module further comprises a connecting member, the connecting member is located at the second carrier board or the first-stage power supply unit, and the connecting member is electrically connected with the power input terminals of the first-stage power supply unit.

Optionally, the first-stage power supply unit and the second-stage power supply unit are electrically connected via an alternating current bus, the first-stage power supply unit comprises an alternating current wave generation circuit, or the first-stage power supply unit comprises an alternating current wave generation circuit, and a Buck circuit or a Buck-Boost circuit connected in series with the alternating current wave generation circuit;

the second-stage power supply unit comprises a transformer and a rectifier circuit.

Optionally, the integrated circuit chip comprises a bare chip and a package substrate, the package substrate is located between the bare chip and the first carrier board; one or more capacitors are buried in the package substrate, one end of each capacitor is electrically connected with a corresponding positive power terminal of the integrated circuit chip, and the other end of the capacitor is electrically connected with a corresponding negative power terminal of the integrated circuit chip.

According to a second aspect of the present disclosure, there is provided an electronic device, which includes an integrated circuit chip assembly and the power supply module as mentioned in any one of the above;

wherein the integrated circuit chip assembly comprises an integrated circuit chip and a first carrier board, and the integrated circuit chip is located at the first side of the first carrier board.

According to a power supply module and an electronic device of some embodiments of the present invention, the power supply module is divided into two-stage power supply units (i.e. a first-stage power supply unit and a second-stage power supply unit), and the second-stage power supply unit that directly supplies power to an integrated circuit chip is at least partially located right under the integrated circuit chip, thereby realizing the vertical power supply to the integrated circuit chip by the second-stage power unit and reducing the occupation of trace space and surface space of the first carrier board.

By referring to the following detailed description and drawings of the present invention, features and technical content of the present invention will be further understood, but the detailed description and drawings herein are only used to illustrate the present invention, not to limit the scope of claims of the present invention.

BRIEF DESCRIPTION OF THE DRAWINGS

The above and other features and advantages of the present invention will become more apparent by describing in detail exemplary embodiments thereof with reference to the accompanying drawings.

REFERENCE NUMERALS

Figure 1:
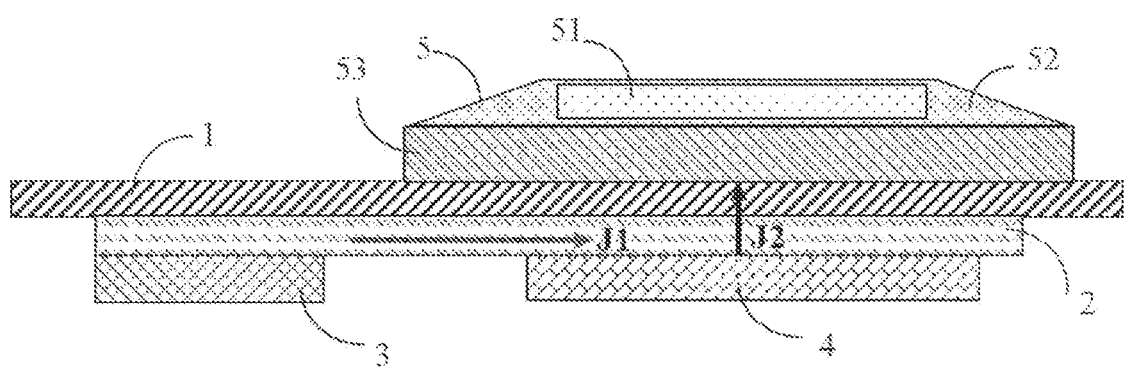
FIG. 1 is a schematic diagram of a power supply module used in an integrated circuit chip according to a first embodiment of the present invention.

| | |
|---|---|
| 1 | First Carrier Board |
| 11 | First Carrier Board Signal Via |
| 12 | First Carrier Board Power Via |
| 2 | Second Carrier Board |
| 21 | Second Carrier Signal Via |
| 22 | Second Carrier Power Via |
| 221 | Positive Power Via |
| 222 | Negative Power via |
| 23, 26 | First Sub-Carrier Board |
| 24, 27 | Second Sub-Carrier Board |
| 25 | Third Sub-Carrier Board |
| 3 | First-Stage Power supply unit |
| 4 | Second-Stage Power supply unit |
| 5 | Integrated Circuit Chip |
| 51 | Bare Chip or die |
| 52 | Insulating Packaging Material |
| 53 | Package Substrate |
| 54 | Signal Terminal |
| 55 | Power Terminal |
| 551 | Positive Power Terminal |
| 552 | Negative Power Terminal |
| 56 | Socket |
| 6 | Connecting Member |
| 7 | Connection Terminal |
| 8 | Passive Element |
| 81 | Capacitor |
| 82 | Inductor |
| 95 | Heat Sink |
| 96 | Bolt |
| 97 | Reinforcing Board |

DETAILED DESCRIPTION

Hereinafter, embodiments of the present invention will be described in detail. Examples of the embodiments are shown in the drawings, in which the same or similar reference numerals indicate the same or similar elements or elements having the same or similar functions throughout the present application. The embodiments described below with reference to the drawings are exemplary, and are intended to explain the present invention, and should not be construed as limiting the present invention.

In the description of the present invention, it should be understood that the terms 'upper', 'lower', 'front', 'behind', 'left', 'right'. 'vertical', 'horizontal', 'top', 'bottom', 'inner', 'outer', etc. refer to orientation or positional relationship indicated based on the orientation or positional relationship shown in the drawings, which is only for the convenience of describing the present invention and simplifying the description, rather than indicating or implying that the device or element must has a specific orientation or constructed and operated in a specific orientation, and therefore cannot be construed as limiting the present invention.

In addition, the terms 'first' and 'second' are used for description purposes only, and cannot be understood as indicating or implying relative importance or implicitly indicating the number of technical features indicated. Thus, the features defined with 'first' and 'second' may include at least one of the features either explicitly or implicitly. In the description of the present invention, the meaning of 'a plurality of' is at least two, such as two, three, etc., unless specifically defined otherwise.

In the present invention, unless otherwise clearly specified and limited, the terms 'installed', 'connected with', 'connected'. 'fixed' and other terms should be understood in a broad sense, for example, it can be a fixed connection or a detachable connection, or it can be integrated; it may be directly connected or indirectly connected through an intermediate medium, it may be a connective relationship between the two elements or an interaction relationship of the two elements, unless otherwise clearly defined. Those of ordinary skill in the art can understand the specific meanings of the above terms in the present invention according to specific situations.

In the description of this specification, the description referring to the terms 'one embodiment', 'some embodiments', 'examples', 'specific examples', or 'some examples' means specific features, structures, materials or characteristics described in conjunction with the embodiment or examples are included in at least one embodiment or example of the present invention. In this specification, the schematic representation of the above terms does not necessarily refer to the same embodiment or example. Moreover, the specific features, structures, materials, or characteristics described may be combined in any suitable manner in any one or more embodiments or examples. In addition, without contradicting each other, those skilled in the art may combine and incorporate different embodiments or examples and features of the different embodiments or examples described in this specification.

FIG. 1 is a schematic diagram of a power supply module used in an integrated circuit chip according to a first embodiment of the present invention. As shown in FIG. 1, the power supply module is used for an integrated circuit chip assembly. The integrated circuit chip assembly includes an integrated circuit chip 5 and a first carrier board 1. The integrated circuit chip 5 is disposed on a first side of the first carrier board 1. The power supply module includes a second carrier board 2 and a two-stage power supply unit. The two-stage power supply unit includes a first-stage power supply unit 3 and a second-stage power supply unit 4, respectively. A power input terminal of the second-stage power supply unit 4 and the power output terminal of the first-stage power supply unit 3 are electrically connected through the second carrier board 2. The power output terminal of the second-stage power supply unit 4 is electrically connected with the power terminal of the integrated circuit chip 5. There is an overlapping region between projection of the second-stage power supply unit 4 on a first plane and projection of the integrated circuit chip 5 on the first plane, that is, the projection of the second-stage power supply unit 4 on the first plane is at least partially located within the projection range of the integrated circuit chip 5 on the first plane. The first plane is parallel to the first carrier board 1, for example, the first plane is parallel to an upper surface or a lower surface of the first carrier board 1.

In this embodiment, the second carrier board 2 is disposed on a second side of the first carrier board 1, and the second side is disposed opposite to the first side. The first-stage power supply unit 3 and the second-stage power supply unit 4 are both disposed on a side of the second carrier board 2 facing away from the first carrier board 1. An output terminal of the first-stage power supply unit 3 and an input terminal of the second-stage power supply unit 4 both are in contact with and electrically connected to the second carrier board 2, and power between the first-stage power supply unit 3 and the second-stage power supply unit 4 is transmitted through the second carrier board 2. The first-stage power supply unit 3 and the second-stage power supply unit 4 are respectively provided with power switches, and power switches of the first-stage power supply unit 3 and the second-stage power supply unit 4 don't have to work with each other cooperatively and can work independently. The second carrier board 2 is different from the first carrier board 1. The first carrier board 1 can be used as a mainboard of the integrated circuit chip 5, on which the integrated circuit chip 5 can be arranged, and the integrated circuit chip 5 can be a power supply management chip or a memory chip, etc., other electronic devices can also be disposed on the first carrier board 1. The second carrier board 2 is used to transmit power between two-stage power supply units (i.e. the first-stage power supply unit 3 and the second-stage power supply unit 4). As shown in FIG. 1, the power transmission between the first-stage power supply unit 3 and the second-stage power supply unit 4 is along a direction indicated by the arrow J1, and the power transmission for supplying power to the integrated circuit chip 5 by second-stage power supply unit 4 is along a direction indicated by the arrow J2.

The advantages of using the power supply module including the second carrier board 2 and the two-stage power supply unit in the present disclosure are that:

(1) Occupation for trace space or surface space of the first carrier board 1 is reduced. As shown in FIG. 1, traces between the first-stage power supply unit 3 and the second-stage power supply unit 4 do not need to be provided on the first carrier board 1, which saves trace space for the first carrier board 1. Furthermore, the second-stage power supply unit 4 directly supplies power to the integrated circuit chip 5 by vertically passing through the first carrier board 1, which greatly reduces occupation for space of the first carrier board 1 by power traces.

(2) Interference to the signal transmission in the first carrier board 1 during power transmission is reduced. Since power is transmitted from the first-stage power supply unit 3 to the second-stage power supply unit 4 along the second carrier board 2, that is the second-stage power supply unit 4 directly and vertically supplies power to the integrated circuit chip 5 in a vertical direction, there is no need for power passing one or more signal trace regions on the first carrier board 1, thereby reducing the interference to the signal transmission. The vertical direction refers to a direction perpendicular to the first plane.

(3) The second carrier board 2 is designed in a way that helps optimize performance thereof, such as increasing a copper thickness or adopting a lead frame, which makes it easier to achieve small transmission impedance and improve power transmission efficiency and dynamic performance of the power supply module.

(4) Power density of the second-stage power supply unit 4 is improved or height of the second-stage power supply unit 4 is reduced by using two-stage power transmission. The volume of the second-stage power supply unit 4 can be decreased by transferring electronic devices to the first-stage power supply unit 3 as much as possible, for example, one or more controllers or control circuits of the Buck circuit can be transferred to the first-stage power supply unit, which can improve the application scope and flexibility of the power supply module and the electronic device having the power supply module.

Figure 2:
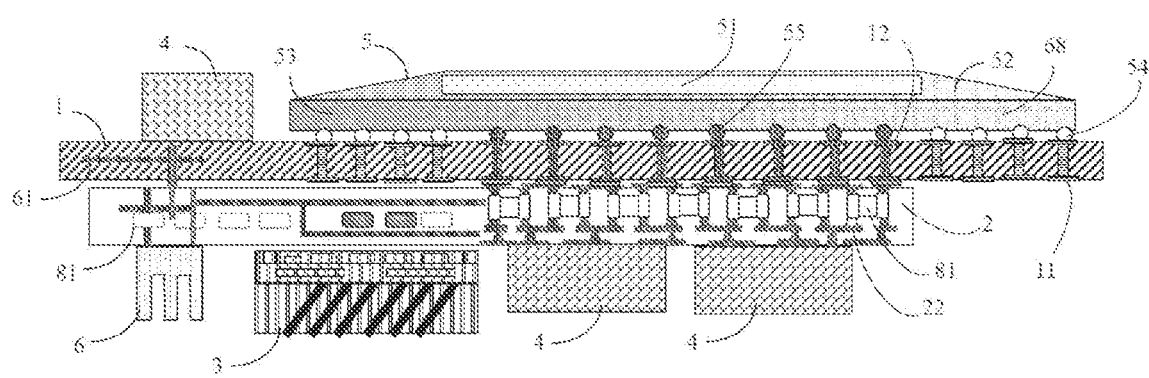
FIG. 2 is a schematic diagram of a power supply module used in an integrated circuit chip according to a second embodiment of the present invention.
Figure 3:
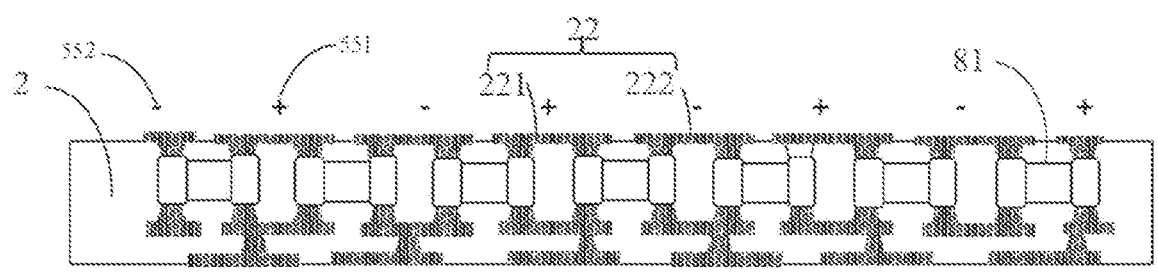
FIG. 3 is a schematic structural diagram of a second carrier board according to the second embodiment of the present invention.
Figure 4:
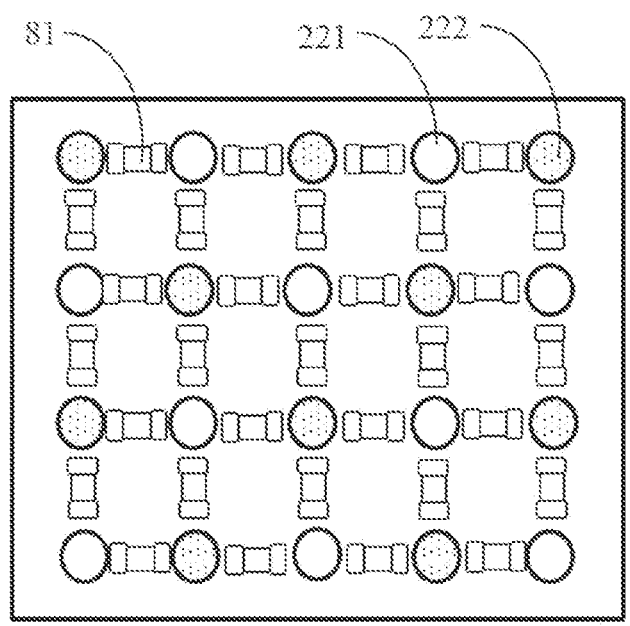
FIG. 4 is a schematic diagram of a first type distribution of power vias and capacitors in the second carrier board according to the second embodiment of the present invention.
Figure 7:
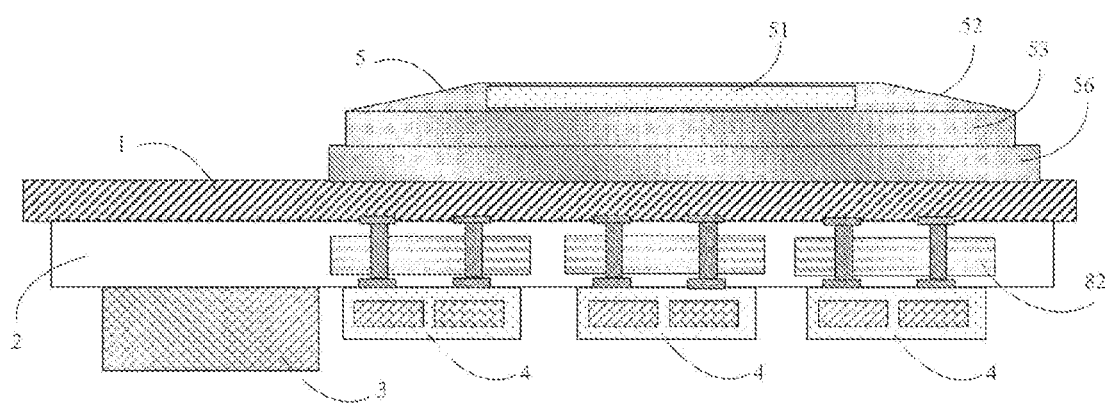
FIG. 7 is a schematic diagram of a power supply module used in an integrated circuit chip according to a third embodiment of the present invention.

The integrated circuit chip 5 in this embodiment is a chip package module used for data processing and used as a load of a power supply module. As shown in FIG. 1, the integrated circuit chip 5 includes at least one bare chip 51, which may further include a packaging substrate 53, and may also include other insulating packaging materials 52. Bare chip also called die. The bare chip 51 is buried in the insulating packaging material 52, and the packaging substrate 53 is used to support the bare chip 51 and expand terminal pitch of the bare chip 51, so as to facilitate to realize external electrical connection in applications. The electrical connection way between the integrated circuit chip 5 and the system mainboard, that is, the first carrier board 1 can be various. For example, BGA solder balls can be provided on a lower surface of the package substrate 53 as one or more signal terminals 54 and power terminals 55. As shown in FIG. 2, BGA solder balls can be soldered to the first carrier board 1 to achieve electrical connection with the first carrier board 1. Of course, a socket 56 may also be provided. As shown in FIG. 7, an array of elastic terminals is provided in the base 56 to achieve electrical connection between the package substrate 53 and the first carrier board 1. It is also possible to realize the electrical connection between the integrated circuit chip 5 and the first carrier board 1 in other ways.

FIGS. 2 to 6 are schematic diagrams of power supply modules applying to an integrated circuit chip according to a second embodiment of the present invention. As shown in FIG. 2, there is an overlapping region between projection of one or more power output terminals of one or more second-stage power supply units 4 on a first plane and projection of one or more power terminals of the integrated circuit chip 5 on the first plane, and one or more second-stage power supply units 4 are located at a side closer to one or more power terminals of the integrated circuit chip 5, so that a vertically supplying power to the integrated circuit chip 5 by second-stage power supply unit 4 can be achieved. In this embodiment, both signal terminals 54 and power terminals 55 of the integrated circuit chip 5 are drawn out from a side which is facing toward the first carrier board 1, and the signal terminals 54 of the integrated circuit chip 5 are located at periphery of the power terminals 55 of the integrated circuit chip 5. The second carrier board 2 is located at a second side of the first carrier board 1.

For example, the integrated circuit chip 5 is located at a first side of the first carrier board 1, the second carrier board 2 is located at a second side of the first carrier board 1, and the two-stage power supply units (i.e. the first-stage power supply unit 3 and the second-stage power supply unit 4) are located at the side of the second carrier board 2 facing away from the first carrier board 1, so a stack structure of the power supply module and the integrated circuit chip 5 is formed. One or more power supply modules can be freely arranged at the lower surface of the second carrier board 2, for example, by adjusting the position of the first-stage power supply unit 3, such that projection of the first-stage power supply unit 3 on the first plane can also be located within projection range of the integrated circuit chip 5 on the first plane, thereby a distance between the first-stage power supply unit 3 and one or more second-stage power supply units 4 is further shortened, which is beneficial to reduce transmission resistance or reduce parasitic parameters, and reduce space occupation of the first carrier board 1.

In some alternative embodiments, a passive element 8 may also be provided in the second carrier board 2. For example, one or more capacitors 81 are buried in a part of the second carrier board 2 vertically corresponding to one or more second-stage power supply units 4, and one or more capacitors 81 in the second carrier board 2 can be used as an input capacitor Cin, as shown in FIGS. 38-43. For another example, one or more capacitors 81 can also be buried in a part of the second carrier board 2 vertically corresponding to the second-stage power supply units 4, and these capacitors 81 can be used as an output capacitor Co, as shown in FIGS. 37-43. For another example, it is also possible to bury other electronic devices in a part of the second carrier board 2 vertically corresponding to a region between the first-stage power supply unit 3 and the second-stage power supply units 4, such as one or more output capacitors of the first-stage power supply unit 3 or one or more input capacitors of the second-stage power supply unit 4. Of course, an inductor element or a resistor element can also be buried in the second carrier board 2. Other electronic devices may also be provided at the lower surface of the second carrier board 2. Such an arrangement is advantageous for simplifying the structure of the first-stage power supply unit 3 or the second-stage power supply units 4 and improving the power density of the first-stage power supply unit 3 or the second-stage power supply units 4.

In some alternative embodiments, a connecting member 6 may also be provided on the second carrier board 2, and the connecting member 6 is electrically connected to one or more power input terminals of the first-stage power supply unit 3 for transmitting external power to the first-stage power supply unit 3. When an input voltage is high, such as 400V, this method can avoid the need for a special design and safety certification for the first carrier board 1 connecting to high voltage, which can simplify the design of the first carrier board 1 and reduce the cost of the first carrier board 1. The installation and fixation of the connecting member 6 is also achieved, which facilitates a plug-type connection of the counterpart connecting member matched with the connecting member 6. The connecting member 6 can also be provided on the first-stage power supply unit 3, so that the input current is directly transmitted to the first-stage power supply unit 3 without passing through the second carrier board 2 (of course, it will not pass through the first carrier board 1), which is more conducive to reduce transmission impedance and increase efficiency. If the input voltage is high voltage, such as 400V, only the first-stage power supply unit 3 needs to contact the high-voltage circuit, in which special safety regulation considerations are required, while high-voltage insulation and safety regulation issues of the second carrier board 2 are not required, which can simplify the design and production of the second carrier board 2 and is beneficial to reduce cost.

In some alternative embodiments, signal traces of the first-stage power supply unit 3 are electrically connected with signal traces of the first carrier board 1, and the power input terminals of the first-stage power supply unit 3 are electrically connected with the first carrier board 1. For example, a solder joint is provided on the second carrier board 2 for connecting with the first carrier board 1 by soldering, so as to achieve power transmission between the first carrier board 1 and the second carrier board 2. The signal traces or control traces of the first-stage power supply unit 3 or the second-stage power supply unit 4 are electrically connected to the first carrier board 1 via the second carrier board 2. A second-stage power supply unit 4 may also be provided on the first carrier board 1 to provide electric energy to other loads on the first carrier board 1.

As shown in FIG. 2, one or more power vias 22 are provided in the second carrier board 2. Projections of the power output terminals of the second-stage power supply unit 4, the power vias 22 in the second carrier board, and the power terminals 55 of the integrated circuit chip 5 on the first plane have an overlapping region. For example, one or more power output terminals of the second-stage power supply unit 4 are soldered to a lower surface of the second carrier board 2, and one or more power terminal 55 of the integrated circuit chip 5 are soldered to a upper surface of the second carrier board 2 through one or more power vias 12 on the first carrier board 1. The power output terminals of the second-stage power supply unit 4, the power vias 22 in the second carrier board 2, the power vias 12 in the first carrier board 1, and the power terminals 55 of the integrated circuit chip 5 are stacked in the vertical direction, so that the power output terminals of the second-stage power supply unit 4 are electrically connected with the power terminals 55 of the integrated circuit chip 5 through the power vias 22 in the second carrier board, thereby transmitting power to the integrated circuit chip 5.

Figure 5:
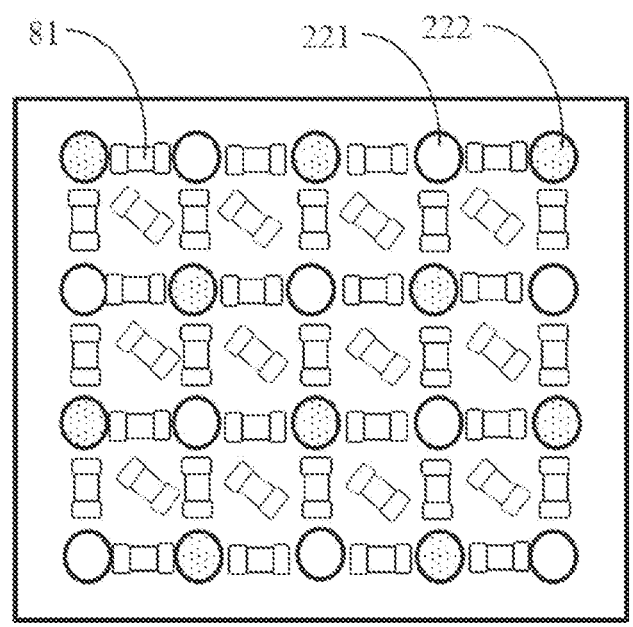
FIG. 5 is a schematic diagram of a second type distribution of power vias and capacitors in the second carrier board according to the second embodiment of the present invention.
Figure 6:
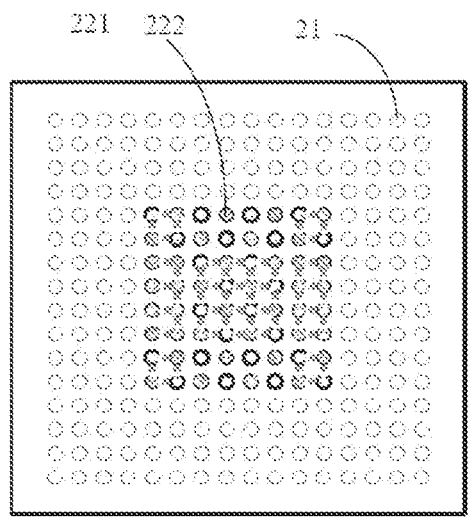
FIG. 6 is a schematic diagram of distribution of power vias and signal vias in the second carrier board according to the second embodiment of the present invention.

As shown in FIGS. 3 to 6, the power vias 22 includes a positive power via 221 and a negative power via 222. At least one capacitor 81 is buried between the power vias 22. A positive end of each of capacitor 81 is electrically connected to a corresponding positive power output terminal of the second-stage power supply unit 4 and a corresponding positive power terminal 551 of the integrated circuit chip 5, respectively, and a negative end of the each of capacitors 81 is electrically connected to a corresponding negative power output terminal of the second-stage power supply unit 4 and a corresponding negative power terminal 552 of the integrated circuit chip 5, respectively. For example, the positive power vias 221 and the negative power vias 222 are alternately arranged. Each of capacitors 81 is buried between a positive power via 221 and a negative power via 222 by a way of lying flat, which are adjacent to each other. The positive end of each of capacitors 81 is close to a corresponding positive power via 221, and the negative end of each of the capacitors 81 is close to a corresponding negative power via 222. The positive end of each of capacitors 81 is electrically connected with a positive power output terminal of the second-stage power supply unit 4 and a positive power terminal 551 of the integrated circuit chip 5 through a corresponding positive power via 221, and the negative end of each of capacitors 81 is electrically connected with a negative power output terminal of the second-stage power supply unit 4 and a negative power terminal 552 of the integrated circuit chip 5 through a corresponding negative power via 222. The capacitors 81 can serve as an output capacitor Co of the second-stage power supply unit 4. This makes transmission path of the current shortened and parasitic inductance of the output loop to which the output capacitor Co is connected reduced. It is beneficial to improve efficiency, dynamic performance, and voltage accuracy of the power supply module. As shown in FIG. 5, it is also possible to arrange capacitors placed obliquely on the basis of the arrangement in FIG. 4, which will place more capacitors in the same area. One end of each of capacitors placed obliquely is electrically connected with a corresponding positive end and the other end is electrically connected with a corresponding negative end. In addition, in this embodiment, signal vias 21 of the integrated circuit chip 5 may be distributed around the power vias 22.

Figure 8:
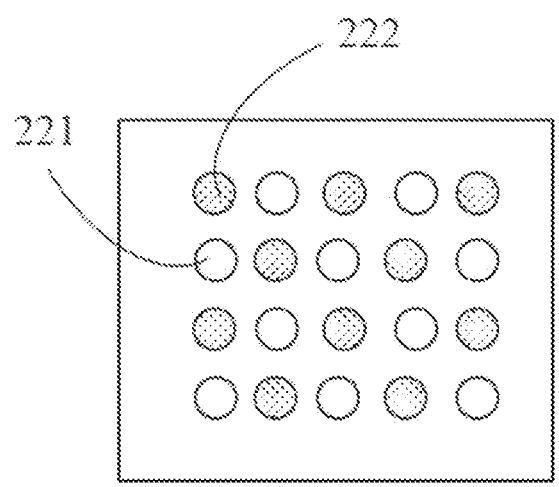
FIG. 8 is a schematic diagram of an arrangement of power output terminals of the second carrier board which is facing toward surface of the first carrier board according to the third embodiment of the present invention.

FIG. 7 is a schematic diagram of a power supply module used in an integrated circuit chip according to a third embodiment of the present invention, and FIG. 8 is a schematic diagram of an arrangement of power output terminals of the second carrier board which is facing toward surface of the first carrier board in FIG. 7, in which each of power vias 22 includes a positive power via 221 and a negative power via 222, and these positive power vias 221 and negative power vias 222 are arranged alternately. As shown in FIG. 7, the power supply module of this embodiment is mainly different from the power supply module of the second embodiment in that; at least one inductor 82 is buried in the second carrier board 2, a winding of each of inductors 82 is perpendicular to the first plane, one end of the winding is connected to a corresponding power output terminal of one of the second-stage power supply units 4, and the other end of the winding is connected to a corresponding power terminal of the integrated circuit chip 5. The inductors 82 can be used as an output inductor of the second-stage power supply units 4, such as an inductor Lo in FIG. 34. The inductors 82 are buried in the second carrier board 2, which can simplify the structure of the second-stage power supply units 4. For example, the inductors 82 may not be integrated in the second-stage power supply units 4, and instead one or more switch chips, such as a chip with a half-bridge circuit, a DrMOS chip integrated with a drive circuit, etc are mainly packaged in the second-stage power supply units 4. The height of the second-stage power supply units 4 can be reduced, so that it is easier to set them on part of the second carrier board, which is vertically corresponding to the integrated circuit chip 5. The windings can be arranged perpendicular to the second carrier board 2 by ways of processing conductive vias or in-burying copper columns. One end of each winding is connected to a corresponding second-stage power supply unit 4, and connected to a chip of the corresponding second-stage power supply unit 4, and the other end of each winding is used as an output terminal to connect to a corresponding load terminal of the first carrier board 1. The projections of the terminals of the integrated circuit chip 5 and the windings on the first plane can also be set to overlap, which is more conducive to shorten the power transmission path of the integrated circuit chip 5 and reduce transmission loss.

Figure 9:
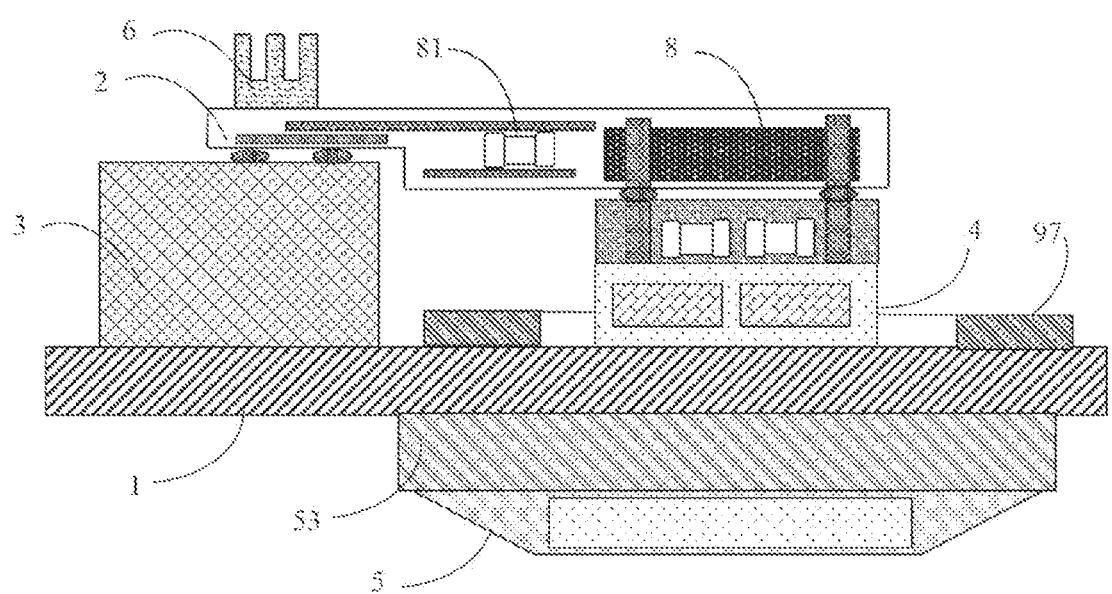
FIG. 9 is a schematic diagram of a first type of power supply module used in an integrated circuit chip according to a fourth embodiment of the present invention.

FIG. 9 is a schematic diagram of a power supply module used in an integrated circuit chip according to a fourth embodiment of the present invention. In this embodiment, an integrated circuit chip 5 is located at a first side of the first carrier board 1, and the first-stage power supply unit 3 and the second-stage power supply unit 4 are located between the second carrier board 2 and a second side of the first carrier board 1. The projection of the second-stage power supply unit 4 on a first plane is located within a projection range of the integrated circuit chip 5 on the first plane, and the projection of the first-stage power supply unit 3 on the first plane is located outside of the projection range of the integrated circuit chip 5 on the first plane. The power is input from a connecting member 6 on the second carrier board 2, and transmitted to the first-stage power supply unit 3 through the second carrier board 2 and transmitted to the second-stage power supply unit 4 through the second carrier board 2, and then transmitted to the integrated circuit chip 5 by the second-stage power supply unit 4. It is convenient for the arrangement and extraction of signal traces of the first carrier board 1, and reduces interference to load signals. The second carrier board 2 can also be optimized to reduce transmission impedance and improve efficiency. In addition, connection surface between the second carrier board 2 and the first-stage power supply unit 3 and connection surface between the second carrier board 2 and the second-stage power supply unit 4 may be set in a stepped shape, so as to connect the second carrier board 2 with the first-stage power supply unit 3 and the second-stage power supply unit 4 with different heights, thereby expanding application scope and adaptability. In addition, FIG. 9 also shows a reinforcing plate (such as a bake plate or a stiffener) 97. The reinforcing plate 97 may be disposed on the other side (i.e., the second side) of the first carrier board 1 opposite to the integrated circuit chip 5, so as to lift the connection reliability of the integrated circuit chip 5, and avoid the deformation of the first carrier board 1. Of course, the reinforcing plate 97 may be disposed on the same side as the integrated circuit chip 5.

Figure 10:
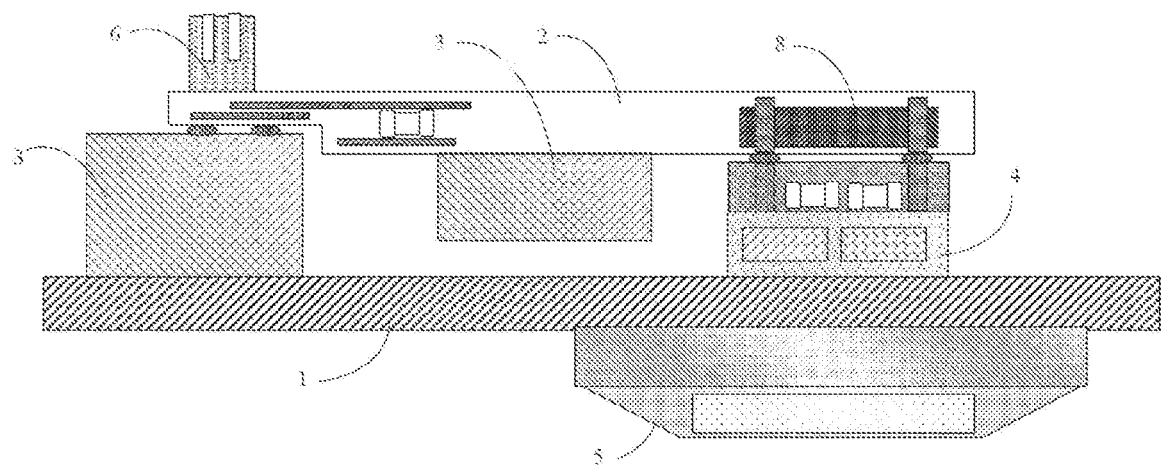
FIG. 10 is a schematic diagram of a second type of power supply module used in an integrated circuit chip according to a fourth embodiment of the present invention.

FIG. 10 is a schematic diagram of a second type of power supply module used in an integrated circuit chip according to a fourth embodiment of the present invention. The main differences between FIG. 10 and FIG. 9 is that one first-stage power supply unit 3 is added in a part of the second carrier board 2 between the first-stage power supply unit 3 and the second-stage power supply unit 4. One second-stage power supply unit 4 may also be added in the part of the second carrier 2 between the first-stage power supply unit 3 and the second-stage power supply unit 4. In this way, a plurality of power supply units can be arranged to increase the power of the power supply module, and the added power supply unit is not in contact with the surface of the first carrier board 1, thereby reducing the occupation of the surface space of the first carrier board 1 and avoiding the interference to the first carrier board 1.

Figure 11:
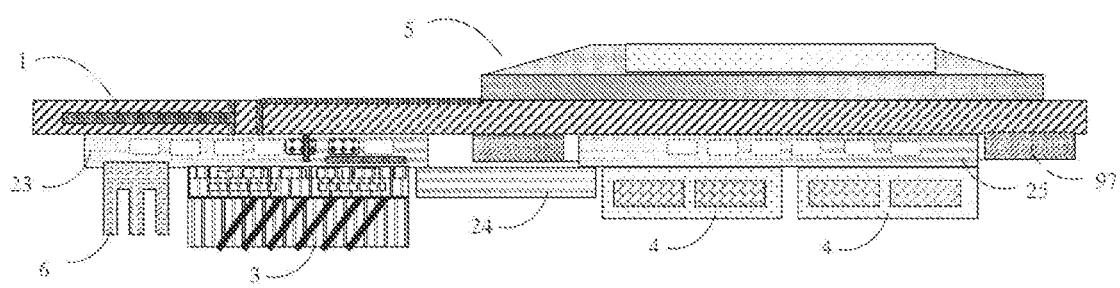
FIG. 11 is a schematic diagram of a first type of power supply module used in an integrated circuit chip according to a fifth embodiment of the present invention.

FIG. 11 is a schematic diagram of a first type of power supply module used in an integrated circuit chip according to a fifth embodiment of the present invention. The main difference between this embodiment and the first embodiment is that the second carrier board 2 can also be composed of a plurality of parts, so as to be suitable for different applications. As shown in FIG. 11, the second carrier board 2 includes a first sub-carrier board 23, a second sub-carrier board 24, and a third sub-carrier board 25. The second sub-carrier board 24 is located between the first sub-carrier board 23 and the third sub-carrier board 25, and the second sub-carrier board 24 is electrically connected to the first sub-carrier board 23 and the third sub-carrier board 25, respectively. The first-stage power supply unit 3 is located at a side of the first sub-carrier board 23 facing away from the first carrier board 1, and the second-stage power supply unit 4 is located at a side of the third sub-carrier board 25 facing away from the first carrier board 1. That is, the first sub-carrier board 23 is located between the first-stage power supply unit 3 and the first carrier board 1, the third sub-carrier board 25 is located between the second-stage power supply unit 4 and the first carrier board 1, and the second sub-carrier board 24 is joint-lapped between the first sub-carrier board 23 and the third sub-carrier board 25 to realize power transmission. In this way, footprint of each sub-carrier board can be reduced. When one or more capacitors or other electronic devices are buried in the first sub-carrier board 23, the second sub-carrier board 24, and the third sub-carrier board 25, stress can be greatly reduced because of the decreasing of the footprint of each sub-carrier board, such as cross-sectional stress of the composite material, thermal stress, etc., thereby improving the reliability of the power supply module and reducing the cost. In addition, a reinforcing plate 97 is also shown in FIG. 11, which can improve the connection reliability of the integrated circuit chip 5 and prevent the deformation of the first carrier board 1.

Figure 12:
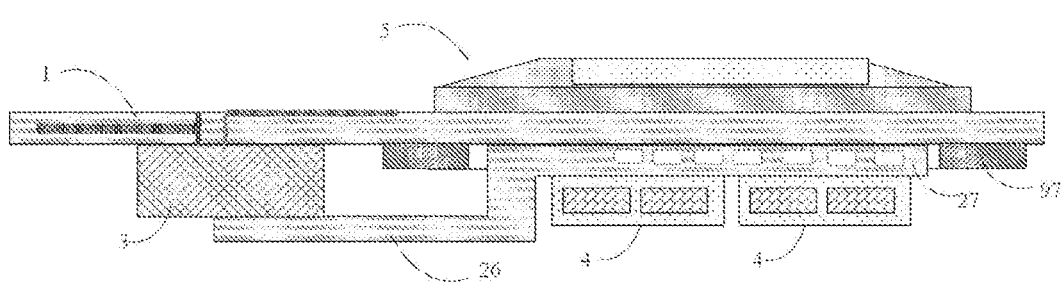
FIG. 12 is a schematic diagram of a second type of power supply module used in an integrated circuit chip according to a fifth embodiment of the present invention.

FIG. 12 is a schematic diagram of a second type of power supply module used in an integrated circuit chip according to a fifth embodiment of the present invention. As shown in FIG. 12, the main difference between this embodiment and the first type of fifth embodiment is that the second carrier board 2 includes a first sub-carrier board 26 and a second sub-carrier board 27, and the first sub-carrier board 26 and the second sub-carrier board 27 are electrically connected. The first-stage power supply unit 3 is located between a second side of the first carrier board 1 and the first sub-carrier board 26, and the second-stage power supply unit 4 is located at a side of the second sub-carrier board 27 facing away from the first carrier board 1. That is, the second sub-carrier board 27 is located between the second-stage power supply unit 4 and the first carrier board 1, and the first sub-carrier board 26 and the second sub-carrier board 27 are joint-lapped to realize power transmission. In this way, positional relationships between the second carrier board 2 and the two-stage power supply units and the first carrier board 1 can be flexibly adjusted according to needs to expand the application range. In addition, a reinforcing plate 97 is also shown in FIG. 12, which can improve the connection reliability of the integrated circuit chip 5 and prevent the deformation of the first carrier board 1.

Figure 13:
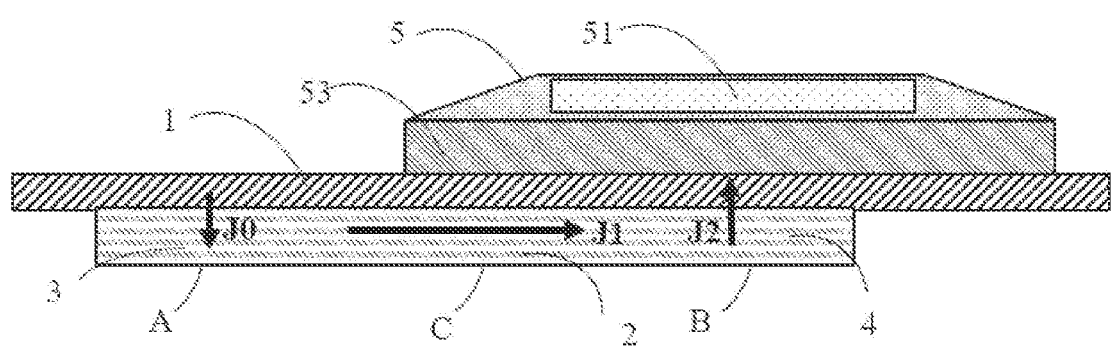
FIG. 13 is a schematic diagram of a first type of power supply module used in an integrated circuit chip according to a sixth embodiment of the present invention.

FIG. 13 is a schematic diagram of a first type of power supply module used in an integrated circuit chip according to a sixth embodiment of the present invention. In this embodiment, the first-stage power supply unit 3, the second-stage power supply unit 4, and the second carrier board 2 form an integrated power supply module, and the integrated power supply module is located at the second side of the first carrier board 1. As shown in FIG. 13, the power supply module is divided into a region A, a region C, and a region B from left to right, wherein a projection of the region A on the first plane is located outside of a projection range of the integrated circuit chip 5 on the first plane and the region A is electrically connected with the first carrier board 1; a projection of the region B on the first plane is located within the projection range of the integrated circuit chip 5 on the first plane and the region B is electrically connected with the first carrier board 1; and the region C is located between the region A and the region B. Current is transmitted from the first carrier board 1 to the region A, and further transmitted to the first-stage power supply unit 3 in the region A, since the first-stage power supply unit 3 can be set in the region A, as shown with an arrow J0. Next, the current can be transmitted to the second-stage power supply unit 4 located in the region B through the region C, as shown with an arrow 31, and then the converted current is transmitted to the integrated circuit chip 5 through the first carrier board 1 again, as shown with an arrow J2. The process of surface-mounting and soldering for the first-stage power supply unit 3, the second-stage power supply unit 4 and the second carrier board 2 to the surface of the first carrier board 1 can be simplified by this arrangement. In addition, such an integrated power supply module can be integrally soldered to the customer's mainboard, in which case only one reflow is required, so it is easier to realize a simplified structure and module integration of the power supply module, which is conducive to improving the power density.

In some alternative embodiments, an isolation structure is provided between the second carrier board 2 and the first carrier board 1, and a projection of the isolation structure on the first plane covers a projection of the signal terminals of the integrated circuit chip 5 on the first plane. For example, an insulating layer may be provided on a surface of the second carrier board 2 close to the first carrier board 1, that is, insulation treatment is performed, so as to avoid the interference to the first carrier board 1 caused by contacting with via end faces or surface traces on the first carrier board 1, especially to isolate the influence of high voltage on the first carrier board 1. A shielding layer may also be provided on the surface of the second carrier board 2 close to the first carrier board 1 to isolate the radiation interference of the high-frequency current on traces in the second carrier board 2 to signal traces on the first carrier board 1, i.e. to reduce Electro Magnetic Interference (EMI). When the surface of the first carrier board 1 has exposed copper, the insulating layer or the shielding layer can play a good role in isolation. In this embodiment, the second carrier board 2 is in contact with the first carrier board 1, and an insulating layer or a shielding layer can be provided in a region on the second carrier board 2 that vertically corresponds to the signal terminals of the integrated circuit chip 5, such as the region C. In addition, the second carrier board 2 of this embodiment has a larger volume, which facilitates to set one or more thick electrical conductors or bury one or more electronic devices in the second carrier board 2, thereby improving power transmission capability and reducing impedance.

Figure 14:
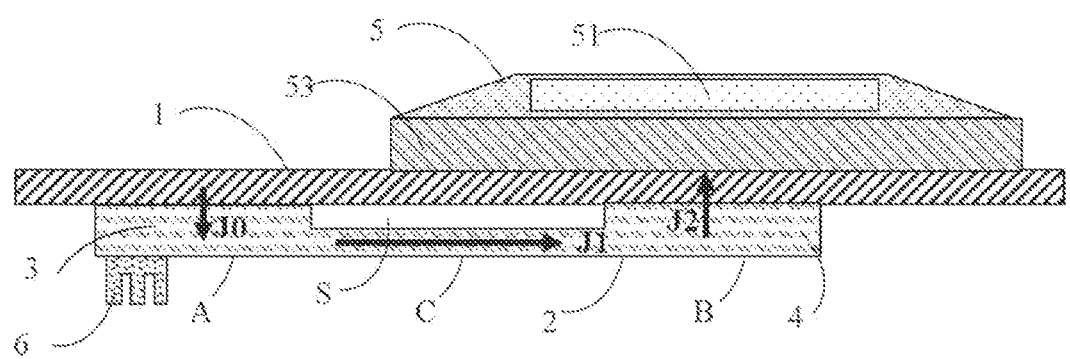
FIG. 14 is a schematic diagram of a second type of power supply module used in an integrated circuit chip according to a sixth embodiment of the present invention.
Figure 15:
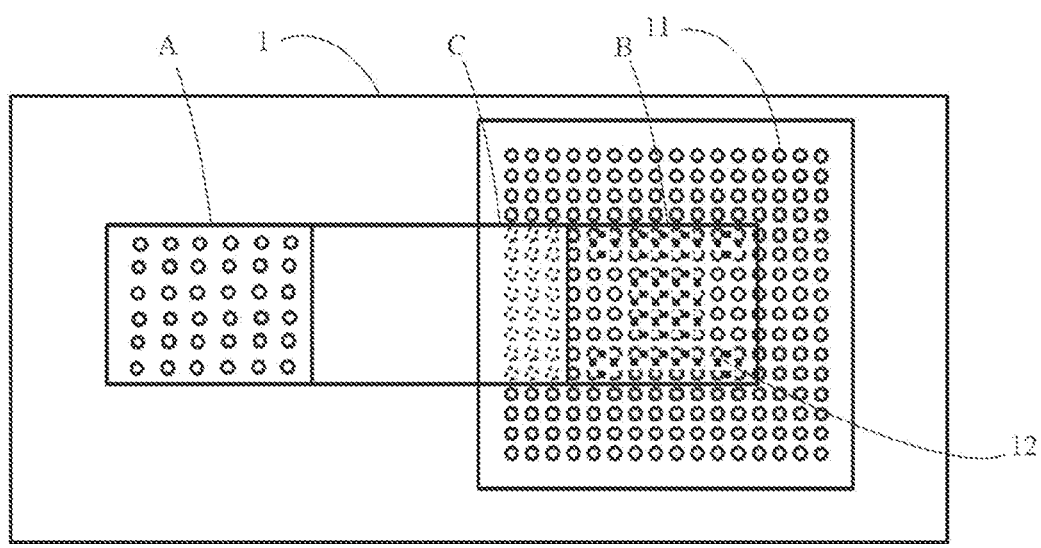
FIG. 15 is a bottom view of the power supply module in FIGS. 13 and 14.

FIG. 14 is a schematic diagram of a second type of power supply module used in an integrated circuit chip according to a sixth embodiment of the present invention. The main difference from FIG. 13 is that a recessed area is provided in the region on the second carrier board 2 that vertically corresponds to the signal terminals of the integrated circuit chip 5 to avoid interference to the signal terminals of the integrated circuit chip 5. For example, a recessed area S is provided on the region C of the second carrier board 2, and the recessed area S helps the second carrier board 2 to keep away from a surface space in which the signal terminals of the integrated circuit chip 5 are distributed on the first carrier board 1, in order to avoid contact of power current and the via end faces, traces or electronic devices on the surface of the first carrier board 1, thereby reducing or avoiding interference. FIG. 15 is a bottom view of the power supply module in FIGS. 13 and 14. The power vias 22 are provided in the region B, and the power output terminals of the second-stage power supply unit 4, the power vias 22 in the region B, the power vias 12 on the first carrier board 1 and the power terminals of the integrated circuit chip 5 are corresponding to each other vertically.

Figure 16:
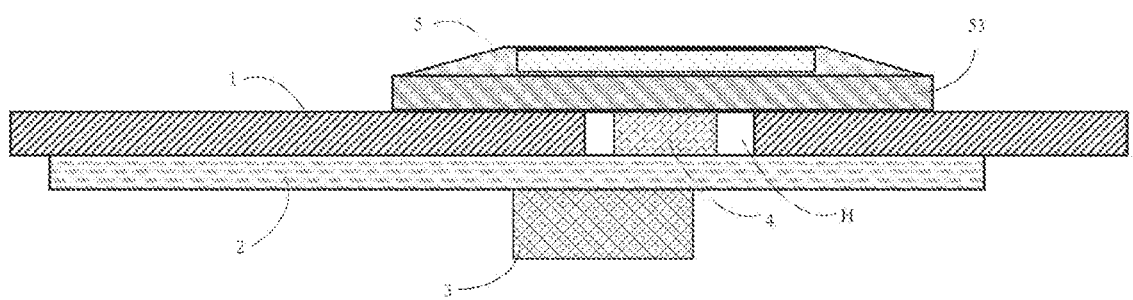
FIG. 16 is a schematic diagram of a power supply module used in an integrated circuit chip according to a seventh embodiment of the present invention.

FIG. 16 is a schematic structural diagram of a power supply module used in an integrated circuit chip according to a seventh embodiment of the present invention. In this embodiment, the first carrier board 1 is provided with one or more openings H, and the second-stage power supply unit 4 passes through the openings H of the first carrier board 1 and is electrically connected to the integrated circuit chip 5. The first-stage power supply unit 3 is located at a side of the second carrier board 2 facing away from the first carrier board 1, and there is an overlapping region between the projection of the first-stage power supply unit 3 on the first plane and the projection of the second-stage power supply unit 4 on the first plane. For example, the integrated circuit chip 5 is disposed above the first carrier board 1, the second carrier board 2 is disposed below the first carrier board 1, the second-stage power supply unit 4 is disposed above the second carrier board 2, and the first-stage power supply unit 3 is disposed below the second carrier board 2. The second-stage power supply unit 4 is located in one of the openings of the first carrier board 1, and the second-stage power supply unit 4 can be arranged as a structure having one or more terminals on both upper and lower surfaces, the upper terminals are electrically connected with the integrated circuit chip 5, and the lower terminals are electrically connected with the second carrier board 2. The second-stage power supply unit 4 directly transmits current transmitted by the second carrier board 2 to the integrated circuit chip 5 without having to pass through the first carrier board 1 at all. In addition, the first-stage power supply unit 3 and the second-stage power supply unit 4 are stacked in a vertical direction, which further reduces the occupation of the area of the first carrier board 1 and shortens the length of the power transmission path. The terminals of the second-stage power supply unit 4 can be arranged vertically corresponding to the power terminals of the integrated circuit chip 5, which can further shorten the length of the current transmission path, and help to reduce the number of power terminals of the integrated circuit chip 5 and the cost of the integrated circuit chip 5.

Figure 17:
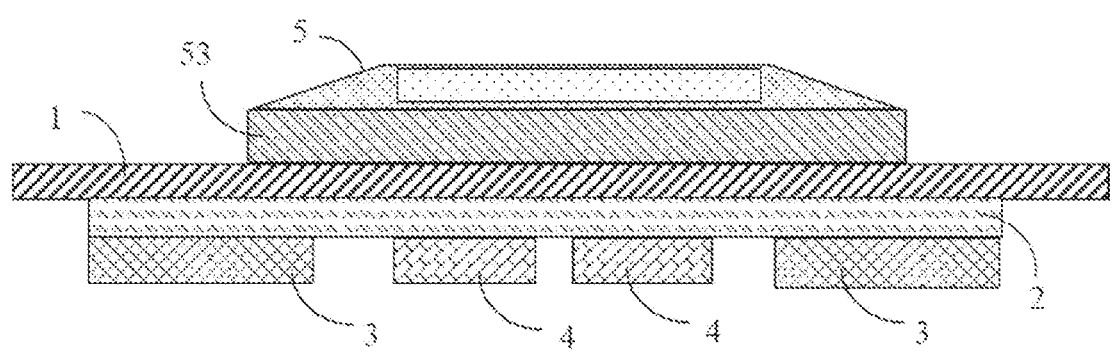
FIG. 17 is a schematic diagram of a power supply module used in an integrated circuit chip according to an eighth embodiment of the present invention.

FIG. 17 is a schematic structural diagram of a power supply module used in an integrated circuit chip according to an eighth embodiment of the present invention. The main difference between this embodiment and the first embodiment is that the number of the first-stage power supply unit 3 is multiple, the number of the second-stage power supply unit 4 is multiple, and a plurality of second-stage power supply units 4 are connected in parallel. Projections of a plurality of first-stage power supply units 3 on the first plane are located on at least two sides of all projections of the plurality of second-stage power supply units 4 on the first plane, i.e. a whole projection of the plurality of second-stage power supply units 4 on the first plane, respectively. The projection of the first-stage power supply unit 3 on the first plane is at least partially located outside of the projection range of the integrated circuit chip 5 on the first plane. The plurality of first-stage power supply units 3 are arranged around the second-stage power supply units 4, which can facilitate the first-stage power supply units 3 to supply power to the second-stage power supply units 4, and the first-stage power supply units 3 can simultaneously supply power to the second-stage power supply units 4 from the different directions, thereby further reducing the impedance and improving the supply power efficiency of the power supply module. It should be noted that, in other embodiments, the number of the first-stage power supply units 3 may be one or more, and the number of the second-stage power supply units 4 may be one or more, which is not limited in this application.

Figure 18:
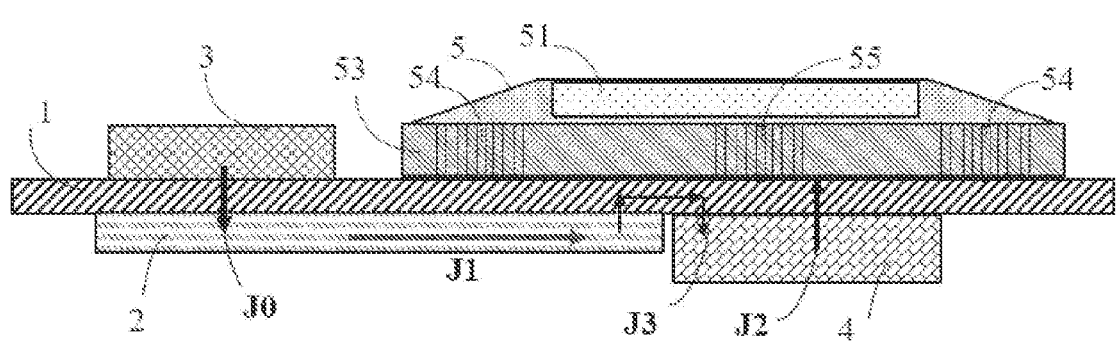
FIG. 18 is a schematic diagram of a first type of power supply module used in an integrated circuit chip according to a ninth embodiment of the present invention.

FIG. 18 is a schematic structural diagram of a first type of power supply module applied to an integrated circuit chip according to a ninth embodiment of the present invention. In this embodiment, there is no overlapping region between the projection of the second-stage power supply unit 4 on the first plane and the projection of the second carrier board 2 on the first plane. For example, the first-stage power supply unit 3 is located at a first side of the first carrier board 1, the second carrier board 2 and the second-stage power supply unit 4 are both located at a second side of the first carrier board 1, the projection of the second-stage power supply unit 4 on the first plane is located within a projection range of the integrated circuit chip 5 on the first plane, and the projection of the first-stage power supply unit 3 on the first plane is located outside of the projection range of the integrated circuit chip 5 on the first plane. The second power supply unit 4 and the second carrier board 2 are not stacked on each other in the vertical direction, that is, there is no overlapping region between the projection of the second level power supply unit 4 on the first plane and the projection of the second carrier board 2 on the first plane. The power is transmitted from the first-stage power supply unit 3 to the second carrier board 2 via the first carrier board 1, as shown with an arrow J0; transmitted along the second carrier board 2 from left to right, as shown with an arrow J1; transmitted to the second-stage power supply unit 4 via the first carrier board 1, as shown with an arrow J3; and then transmitted from the second-stage power supply unit 4 to the integrated circuit chip 5 via the first carrier board 1, as shown with an arrow J2. It is worth noting that a projection region of the regions where the arrow J3 is located in on the first plane should located between the projection of the signal terminals 54 on the first plane and the projection of the power terminals 55 on the first plane, and the three do not overlap each other. This is advantageous for the second carrier board 2 to skip regions where the signal terminals 54 of the integrated circuit chip 5 are located in, to transmit the power output by the first-stage power supply unit 3, thereby realizing the transmission of a large current, while avoiding the interference to signal traces of the first carrier board 1. In addition, since the second-stage power supply unit 4 is not stacked with the second carrier board 2, it is more advantageous to reduce the height of the overall electronic device, or to provide more space for the second-stage power supply unit 4 in height, and is conducive to enhancing the performance of the second power supply unit 4.

Figure 19:
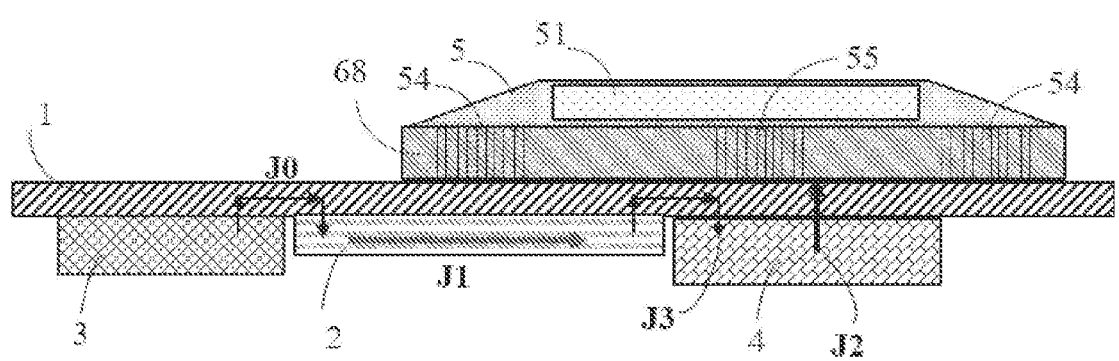
FIG. 19 is a schematic diagram of a second type of power supply module used in an integrated circuit chip according to a ninth embodiment of the present invention.

FIG. 19 is a schematic structural diagram of a second type of power supply module applied to an integrated circuit chip according to a ninth embodiment of the present invention. The main difference between this embodiment and FIG. 18 is that the first-stage power supply unit 3 is provided on the second side of the first carrier board 1, and the first-stage power supply unit 3 and the second carrier board 2 are not stacked on each other in the vertical direction. That is, there is no overlapping region between the projection of the first-stage power supply unit 3 on the first plane and the projection of the second carrier board 2 on the first plane. The first-stage power supply unit 3 is connected to the second carrier board 2 through traces on the first carrier board 1, and then the second carrier board 2 and the second-stage power supply unit 4 are electrically connected through traces on the adjacent first carrier board 1. In a current transmission process, by using the second carrier board 2, a signal region of the integrated circuit chip 5 can be crossed over so as to avoid interference to the signal transmission. In addition, since the power supply units and the second carrier board 2 are not stacked, the height of the power supply module can be effectively reduced and the scope of application can be expanded.

Figure 20:
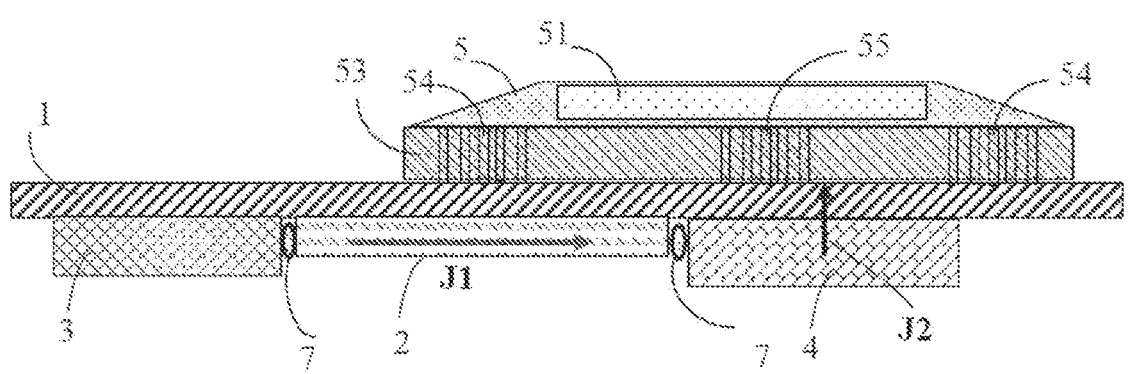
FIG. 20 is a schematic diagram of a third type of power supply module used in an integrated circuit chip according to a ninth embodiment of the present invention.

FIG. 20 is a schematic structural diagram of a third type of power supply module applied to an integrated circuit chip according to a ninth embodiment of the present invention. The main difference between this embodiment and FIG. 19 is that the first-stage power supply unit 3 and the second carrier board 2 are electrically connected through one or more connection terminals 7, and the second carrier board 2 and the second-stage power supply unit 4 are also electrically connected through the connection terminals 7. For example, the connection terminals may be drawn out from both a right side of the first-stage power supply unit 3 and a left side of the second carrier board 2, to achieve electrical connection of the second carrier board 2 and the second power supply unit 4 through the connection terminals; the connection terminals may also be drawn out from both a right side of the second carrier board 2 and a left side of the second power supply unit 4, and an electrical connection of the second carrier board 2 and the second power supply unit 4 is achieved through these connection terminals. In this way, the power current can be vertically supplied to the integrated circuit chip 5 directly by the second-stage power supply unit 4 without horizontally passing through the first carrier board 1.

FIGS. 21 to 26 are schematic diagrams of a power supply module used in an integrated circuit chip according to a tenth embodiment of the present invention. FIG. 27 is a schematic structural diagram of an integrated circuit chip suitable for the tenth embodiment. In this embodiment, one or more signal terminals 54 of the integrated circuit chip 5 are drawn out from a side facing toward the first carrier board 1, and one or more power terminals 55 of the integrated circuit chip 5 are drawn out from a side facing away from the first carrier board 1. The second carrier board 2 is located at a side of the integrated circuit chip 5 facing away from the first carrier board 1, and the second-stage power supply unit 4 is also located at the side of the integrated circuit chip 5 facing away from the first carrier board 1. For example, the integrated circuit chip 5 includes a bare chip 51, an insulating packaging material 52 and a packaging substrate 53. The bare chip 51 is buried in the insulating packaging material 52, and the packaging substrate 53 is located between the insulating packaging material 52 and the first carrier board 1. The signal terminals 54 of the integrated circuit chip 5 are drawn out from a side of the packaging substrate 53 facing toward the first carrier board 1, and the power terminals 55 of the integrated circuit chip 5 are drawn out from a side of the insulating packaging material 52 facing away from the first carrier board 1. The power terminals 55 and the signal terminals 54 of the integrated circuit chip 5 are drawn out from different sides of the integrated circuit chip 5, which is conducive to a better separation of power traces and signal traces and a reduction of the interference of the power traces of the integrated circuit chip 5 to the signal traces. Furthermore, it is beneficial to the extraction and arrangement of signal traces, so as to be suitable for different applications. One or more second-stage power supply units 4 are stacked vertically above the power terminals of the integrated circuit chip 5, which can realize that the supply of power to the integrated circuit chip 5 does not pass through the first carrier board 1 at all, so it is more conducive to simplifying the design of the first carrier board 1.

Figure 21:
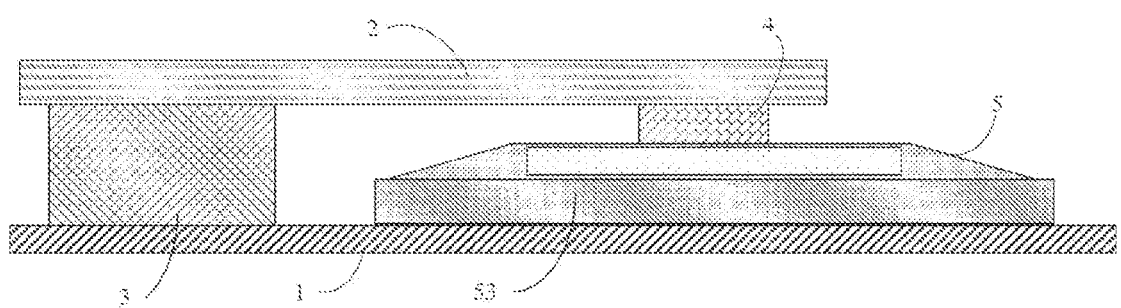
FIG. 21 is a schematic diagram of a first type of power supply module used in an integrated circuit chip according to a tenth embodiment of the present invention.

FIG. 21 is a schematic diagram of a first type of power supply module used in an integrated circuit chip of a tenth embodiment of the present invention. As shown in FIG. 21, the second-stage power supply unit 4 is located between the integrated circuit chip 5 and the second carrier board 2, and the first-stage power supply unit 3 is located between the first side of the first carrier board 1 and the second carrier board 2. For example, the second-stage power supply unit 4 is disposed above the integrated circuit chip 5 and is electrically connected with the power terminals 55 of the integrated circuit chip 5. The electrical connection may be an elastic connection or a soldering connection. Moreover, the second-stage power supply unit 4 may be configured to a structure having one or more terminals on the upper and lower surfaces, the lower terminals are electrically connected with the integrated circuit chip 5, the upper terminals are electrically connected with the second carrier board 2, and the second-stage power supply unit 4 directly transmits current transmitted by the second carrier board 2 to the integrated circuit chip 5 without having to pass through the first carrier board 1 at all. Such an arrangement can realize that the supply of power to the integrated circuit chip 5 does not need to pass through the first carrier board 1 at all and is far away from signal traces of the integrated circuit chip 5. The space of the first carrier board 1 can be further saved for signal trace transmission or setting other functional devices. The first-stage power supply unit 3 may also be located at the side of the second carrier board 2 facing away from the first carrier board 1.

Figure 22:
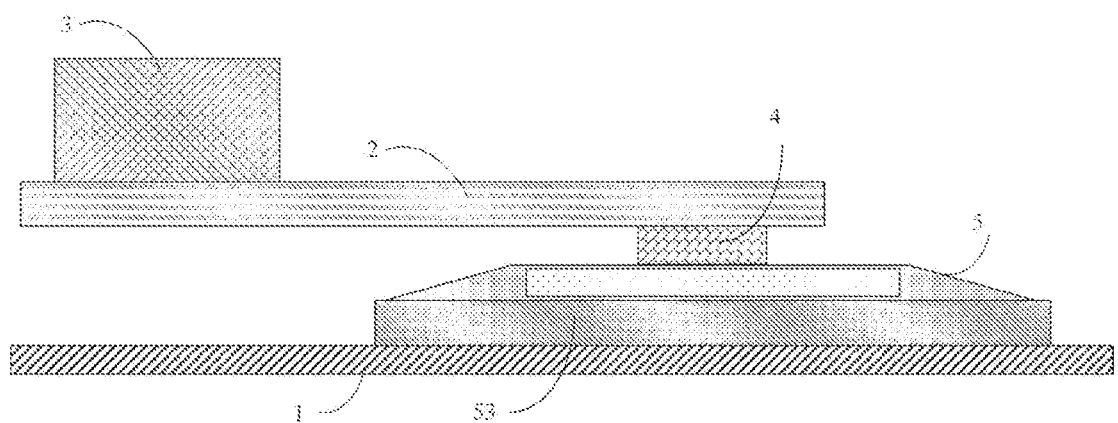
FIG. 22 is a schematic diagram of a second type of power supply module used in an integrated circuit chip according to a tenth embodiment of the present invention.

FIG. 22 is a schematic diagram of a second type of power supply module used in an integrated circuit chip of a tenth embodiment of the present invention. The main difference between this embodiment and FIG. 21 is that the first-stage power supply unit 3 and the second-stage power supply unit 4 are respectively provided on different sides of the second carrier board 2. The second carrier board 2 may be a flexible flat cable. For example, the first-stage power supply unit 3 is disposed above the second carrier board 2, the second-stage power supply unit 4 is disposed below the second carrier board 2, and the first-stage power supply unit 3 and the second-stage power supply unit 4 are not stacked with each other. In some alternative embodiments, the first-stage power supply unit 3 can also be stacked with the second-stage power supply unit 4 to further reduce the occupation of the area of the first carrier board 1 and shorten length of the power transmission path between the first-stage power supply unit 3 and second-stage power supply unit 4. The power output terminals of the second-stage power supply unit 4 can be vertically arranged corresponding to the power terminals of the integrated circuit chip 5 to further shorten the current transmission path and help to reduce the number of power terminals of the integrated circuit chip 5, which is beneficial to reduce the cost of the integrated circuit chip 5. Of course, the first-stage power supply unit 3 can also be stacked with the second-stage power supply unit 4 to further shorten current transmission distance and reduce footprint of the power supply module.

Figure 23:
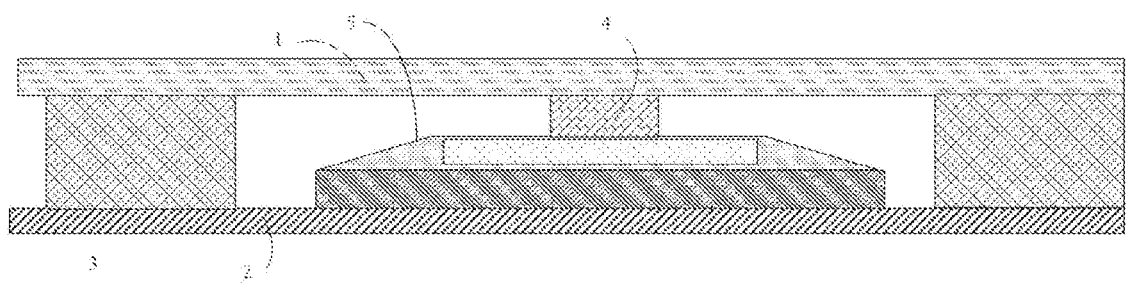
FIG. 23 is a schematic diagram of a third type of power supply module used in an integrated circuit chip according to a tenth embodiment of the present invention.

FIG. 23 is a schematic diagram of a third type of power supply module used in an integrated circuit chip in a tenth embodiment of the present invention. The main difference between this embodiment and FIG. 21 is that a plurality of first-stage power supply units 3 are disposed and the plurality of first-stage power supply units 3 are disposed around the second-stage power supply unit 4. The plurality of first-stage power supply units 3 can simultaneously supply power to the second-stage power supply unit 4 from different directions, so as to facilitate the first-stage power supply unit 3 to supply power to the second-stage power supply unit 4, and can further reduce impedance and improve supply power efficiency of the power supply module. Further, the number of first-stage power supply units 3 or the number of second-stage power supply units 4 can also be increased on the basis of the arrangement in FIG. 23.

Figure 24:
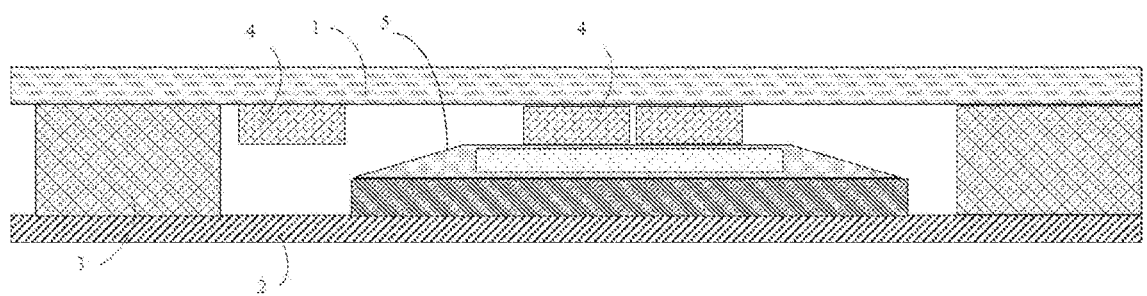
FIG. 24 is a schematic diagram of a fourth type of power supply module used in an integrated circuit chip according to a tenth embodiment of the present invention.

FIG. 24 is a schematic structural diagram of a fourth type of power supply module used in an integrated circuit chip of a tenth embodiment of the present invention. The main difference between this embodiment and FIG. 23 is that one second-stage power supply unit 4 is hung on the second carrier board 2, a projection of the second-stage power supply unit 4 on the first plane is located outside of a projection range of the integrated circuit chip 5 on the first plane, and the number of the second-stage power supply units 4 located directly above the integrated circuit chip 5 is multiple. In this embodiment, supply power capacity of the power supply module can be increased by hanging one or more second-stage power supply units 4 on the second carrier board 2. Furthermore, surface space of the first carrier board 1, i.e. the customer's mainboard, is not or rarely occupied.

Figure 25:
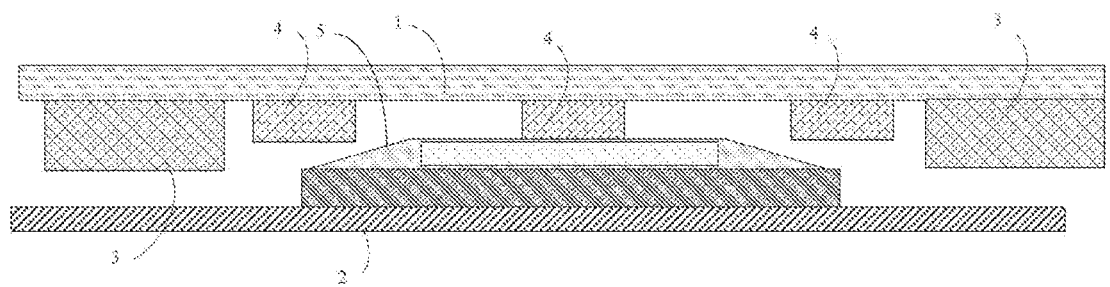
FIG. 25 is a schematic diagram of a fifth type of power supply module used in an integrated circuit chip according to a tenth embodiment of the present invention.

FIG. 25 is a schematic structural diagram of a fifth type of power supply module used in an integrated circuit chip of a tenth embodiment of the present invention. The main difference between this embodiment and FIG. 23 is that a plurality of second-stage power supply units 4 are hung on the second carrier board 2 and a plurality of first-stage power supply units 3 are hung on the second carrier board 2 instead of the direct contact with the first carrier board 1. This embodiment can further reduce the occupation of surface space of the first carrier board 1 and facilitate the arrangement of more other electronic devices on the surface of the first carrier board 1.

Figure 26:
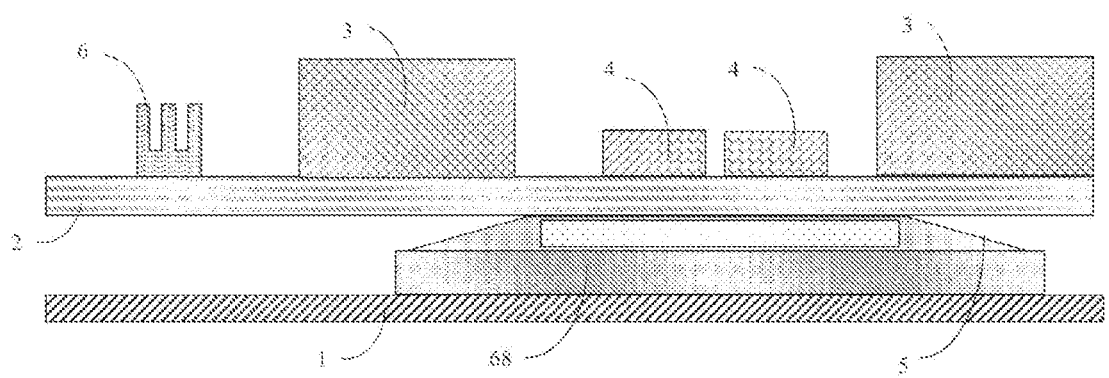
FIG. 26 is a schematic diagram of a sixth type of power supply module used in an integrated circuit chip according to a tenth embodiment of the present invention.
Figure 27:
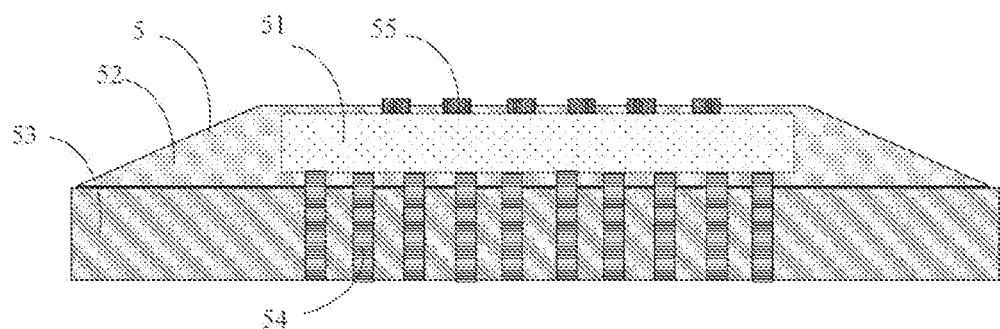
FIG. 27 is a schematic structural diagram of an integrated circuit chip according to a tenth embodiment of the present invention.

FIG. 26 is a schematic structural diagram of a sixth type of power supply module used in an integrated circuit chip of a tenth embodiment of the present invention. The main difference between this embodiment and FIG. 24 is that the second-stage power supply unit 4 is located at a side of the second carrier 2 facing away from the integrated circuit chip 5, and the first-stage power supply unit 3 is also located at the side of the second carrier 2 facing away from the first carrier board 1. For example, the second carrier board 2 is located above the integrated circuit chip 5, and one or more first-stage power supply units 3 and one or more second-stage power supply units 4 are both located above the second carrier board 2. In addition, a connecting member 6 may be provided on the second carrier board 2, and the second carrier board 2 or the first-stage power supply units 3 may be directly electrically connected to an external power supply. The power supply module does not need to pass through the first carrier board 1 to supply power to the integrated circuit chip 5, and the power traces are far from the signal traces of the integrated circuit chip 5, which will not affect the signal transmission of the integrated circuit chip 5. The first-stage power supply unit 3 may also be located between the first side of the first carrier board 1 and the second carrier board 2.

Figure 28:
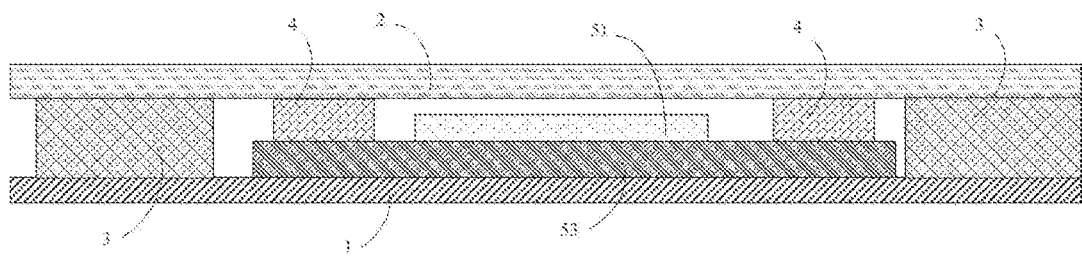
FIG. 28 is a schematic diagram of a first type of power supply module used in an integrated circuit chip according to an eleventh embodiment of the present invention.
Figure 29:
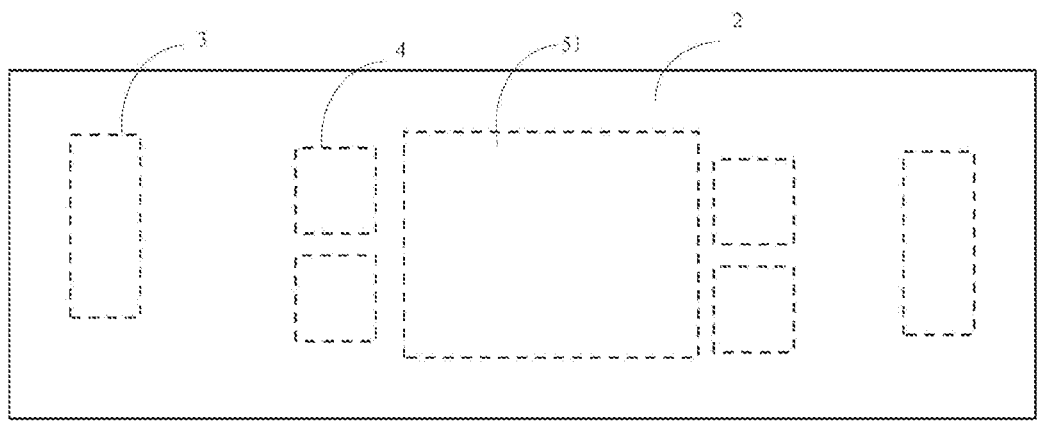
FIG. 29 is a top view of the power supply module in FIG. 28.
Figure 30:
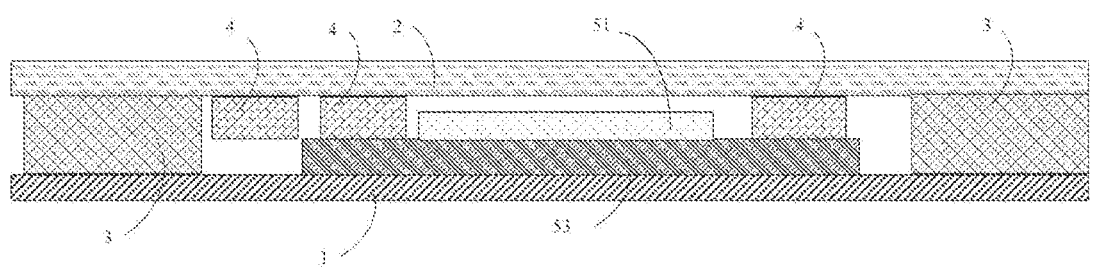
FIG. 30 is a schematic diagram of a second type of power supply module used in an integrated circuit chip according to an eleventh embodiment of the present invention.
Figure 31A:
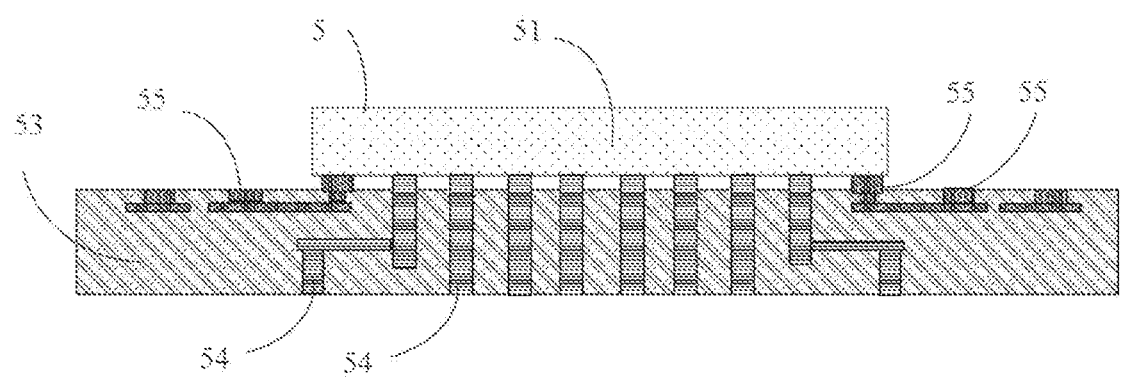
FIG. 31A is a schematic structural diagram of an integrated circuit chip according to an eleventh embodiment of the present invention.

FIG. 28 to 30 are schematic diagrams of a power supply module used in an integrated circuit chip according to an eleventh embodiment of the present invention. FIG. 31A is a schematic structural diagram of an integrated circuit chip according to an eleventh embodiment of the present invention. The integrated circuit chip 5 includes a bare chip 51 and a package substrate 53. The package substrate 53 is located between the bare chip 51 and the first carrier board 1. The signal terminals 54 of the integrated circuit chip 5 are drawn out from a side of the package substrate 53 facing toward the first carrier board 1, and the power terminals 55 of the integrated circuit chip 5 are drawn out from a side of the package substrate 53 facing away from the first carrier board 1. For example, the signal terminals 54 of the integrated circuit chip 5 are drawn out from a lower side of the package substrate 53, the power terminals 55 of the integrated circuit chip 5 are drawn out from a upper side of the package substrate 53, and the drawn-out power terminals 55 are not covered by the integrated circuit chip 5. Preferably, one or more power terminals of the bare chip 51 are arranged at the periphery of the signal terminals thereof, which helps to transmit the power current to the bare chip 51 from around while not crossing over the signal traces, thereby shortening the transmission path and reducing the interference to the signal.

FIG. 28 is a schematic structural diagram of a first type of a power supply module applied to an integrated circuit chip according to an eleventh embodiment of the present invention. FIG. 29 is a top view of the power supply module in FIG. 28. One or more second-stage power supply units 4 are located between the integrated circuit chip 5 and the second carrier board 2, and one or more first-stage power supply units 3 are located between the first side of the first carrier board 1 and the second carrier board 2. For example, when the second-stage power supply units 4 are directly placed above the drawn-out power terminals 55, the second-stage power supply units 4 directly supply power to the bare chip 51 through the packaging substrate 53. The power current may not pass through the first carrier board 1, and the power transmission path is short, which is beneficial to improve efficiency and dynamic performance of the power supply module. One or more signal terminals 54 can be directly connected to the first carrier board 1 via the package substrate 53. There is no cross between externally connected power traces of the bare chip 51 and externally connected signal traces of the bare chip 51, which is beneficial to reduce the interference of the power traces to the signal traces. In addition, the second-stage power supply unit 4 and the bare chip 51 can use the same heat sink or heat dissipation path to facilitate heat dissipation.

FIG. 30 is a schematic diagram of a second type of power supply module used in an integrated circuit chip according to an eleventh embodiment of the present invention. The main difference between this embodiment and FIG. 28 is that one or more second-stage power supply units 4 are further added to the power supply module of FIG. 28, and the second-stage power supply units 4 are hung on the second carrier board 2. By hanging other second-stage power supply units 4 on the second carrier board 2, it is advantageous to increase the supply of power and reduce the occupation of the surface of the first carrier board 1. The connection between the second carrier board 2 and the second-stage power supply unit 4 can be performed by way of soldering, elastic electrical connection, and so on.

Figure 31B:
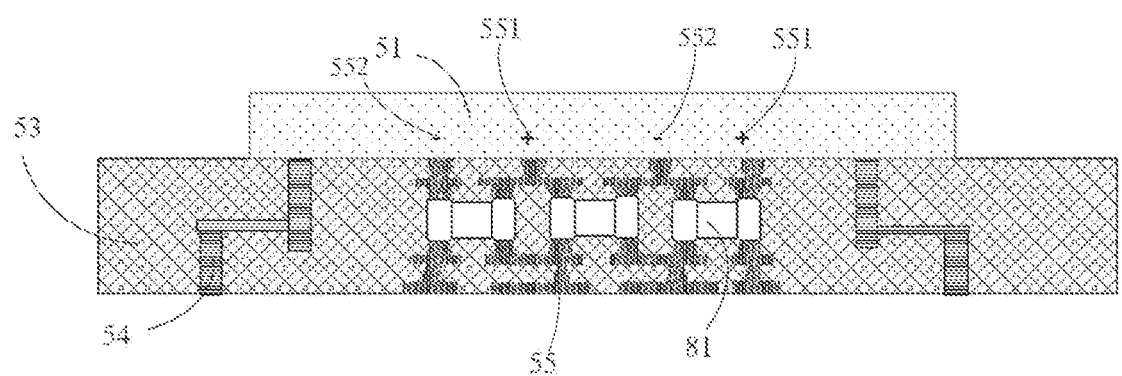
FIG. 31B is a schematic structural diagram of an integrated circuit chip with a capacitor buried in a package substrate according to some embodiments of the present invention.

FIG. 31B is a schematic structural diagram of an integrated circuit chip with a capacitor buried in a package substrate. The integrated circuit chip 5 includes a bare chip 51 and a package substrate 53. In the present application, the package substrate 53 is located between the bare chip 51 and the first carrier board 1. One or more capacitors 81 are buried in the package substrate 53. One end of each capacitor 81 is electrically connected with a corresponding positive power terminal 551 of the integrated circuit chip 5, and the other end is electrically connected with a corresponding negative power terminal 552 of the integrated circuit chip 5. The capacitors 81 can be used as an input capacitor of the integrated circuit chip 5, such a packaging structure can make the input capacitor more closer to the bare chip 51, which is more conducive to reducing input parasitic inductance and impedance of the bare chip 51, and is more conducive to improving the dynamic performance of the input power and improving the operation performance of the integrated circuit chip 5. At the same time, the structure of the power supply module is more compact, and this helps the power supply module being close to the integrated circuit chip 5 and improves efficiency and power density of the power supply module.

Figure 32:
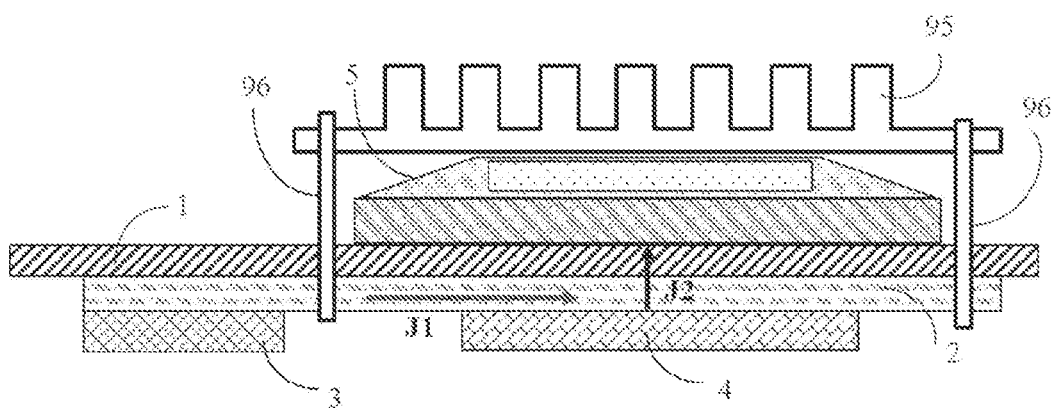
FIG. 32 is a schematic diagram of a power supply module used in an integrated circuit chip according to a twelfth embodiment of the present invention.

FIG. 32 is a schematic structural diagram of a power supply module used in an integrated circuit chip according to a twelfth embodiment of the present invention. In this embodiment, the second carrier board 2 can further be used as a reinforcing back plate, a heat sink 95 can be disposed above the integrated circuit chip 5, and the heat sink 95 and the second carrier board 2 can be connected by one or more fasteners 96, such as bolts. The mounting method of the fasteners 96 is to provide screw holes on the second carrier board 2, and vias may be disposed at positions of the first carrier board 1 corresponding to the fasteners 96, so as to fix the heat sink 95 and pressurize the integrated circuit chip 5 appropriately, thereby reducing thermal resistance. In addition, the second carrier board 2 can also increase rigidity and strength of the first carrier board 1 in a region where the integrated circuit chip 5 is mounted, which is beneficial to improve connection reliability of the integrated circuit chip 5 and the first carrier board 1.

Figure 33:
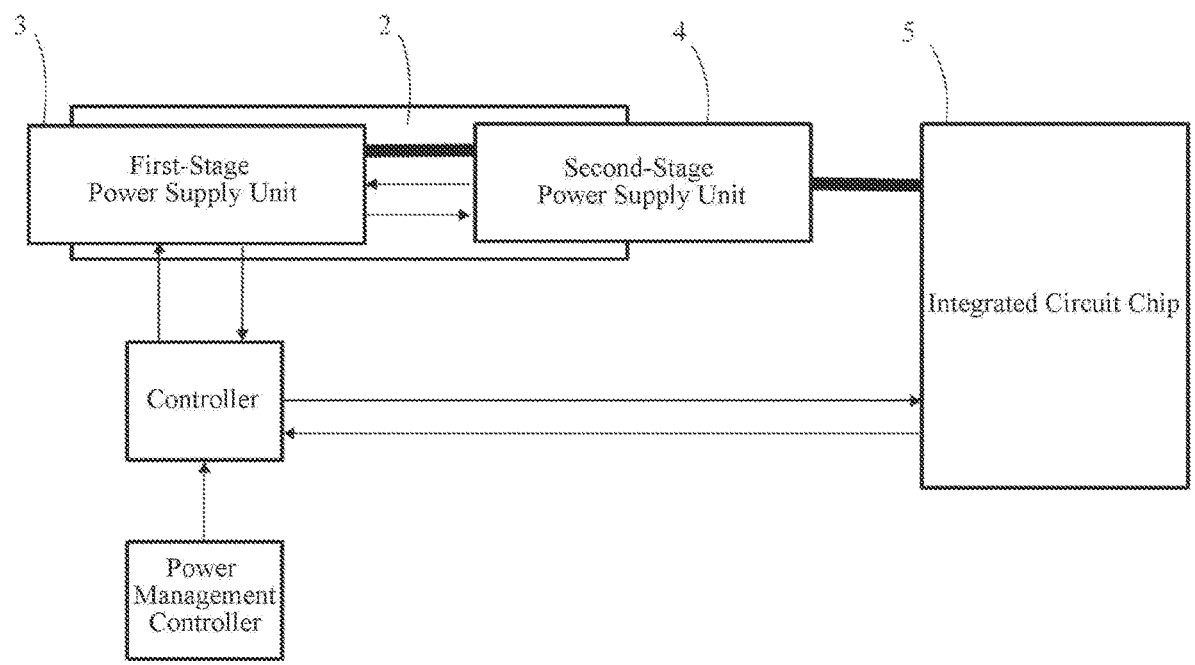
FIG. 33 is a block diagram of control principle of a power supply module according to some embodiments of the present invention.

FIG. 33 is a block diagram of control principle of a power supply module according to some embodiments of the present invention. As shown in FIG. 33, power is directly transmitted between the second-stage power supply unit 4 and the integrated circuit chip 5 in the direction indicated by thick lines, and signal traces can be transmitted to the first-stage power supply unit 3 through the second carrier board 2 and then connected to the first carrier board 1, or connected to the first carrier board 1 via the second carrier board 2. For example, if the second-stage power supply unit 4 is a Buck circuit (buck converter circuit), a pulse width modulation (PWM) control signal of the Buck circuit and a sampling signal 1 of output power current, as well as an operating temperature signal T and the like of the power chip in the Buck circuit are transmitted to the first carrier board 1 via the second carrier board 2 or the first-stage power supply unit 3, and are connected with a controller provided on the first carrier board. Of course, the controller can also be set on the second carrier board. The controller may also be connected to a power management controller on the first carrier board 1, for example, by transmitting an enable signal through a Power Management (PM) bus. Such an arrangement can simplify power output terminals of the second-stage power supply unit 4 and better match power terminals of the integrated circuit chip 5, which is beneficial to improving efficiency and dynamic performance of the power supply module and increasing power density.

Figure 34:
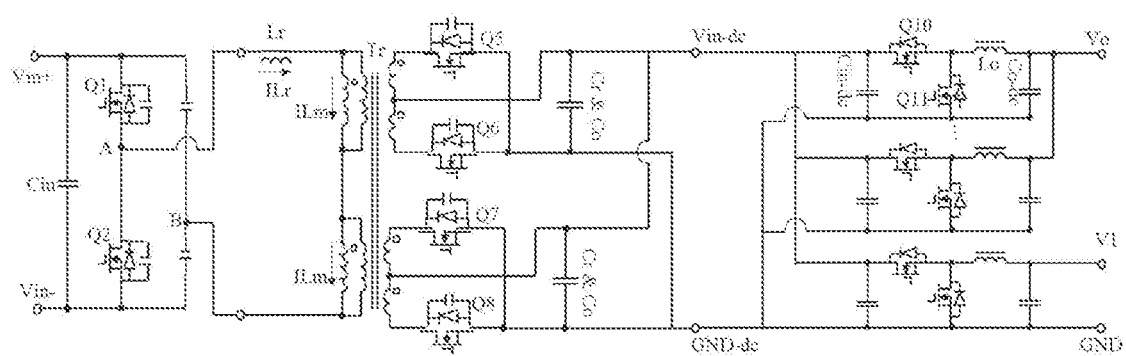
FIG. 34 is a circuit diagram of a two-stage power supply module according to some embodiments of the present invention.

FIG. 34 is a circuit diagram of a power supply module with a two-stage architecture according to some embodiments of the present invention. A LLC circuit is used in a front stage, and a Buck circuit is used in a rear stage. The rear stage can be a plurality of Buck circuits interleaved in parallel to improve supply power capability.

Figure 35:
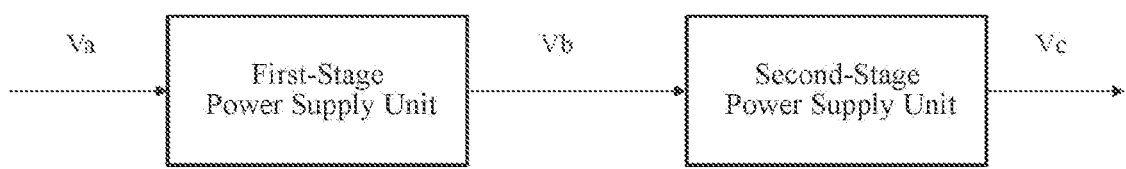
FIG. 35 is a schematic diagram of voltage variation of a power supply module according to some embodiments of the present invention.

FIG. 35 to 36 schematically illustrate several possible two-stage power supply module architectures, and voltages marked in the figures are examples. FIG. 35 shows that the first-stage power supply unit performs step-down at a fixed ratio, and the second-stage power supply unit adjusts the voltage by way of step-down. For example, the first-stage power supply unit adopts an LLC module, and the second-stage power supply unit adopts a Buck circuit, wherein Va may be 48V DC or 400V DC, Vb may be 5V DC, and Vc may be IV DC. In some alternative embodiments, the first-stage power supply unit performs voltage regulation, a ratio of average input voltage to average output voltage is 1:1; and the second-stage power supply unit performs step-down at a fixed ratio. For example, the first-stage power supply unit adopts a Buck/Boost circuit, and the second-stage power supply unit adopts an LLC circuit, wherein Va may be 48V DC or 400V DC, Vb may be 48V DC or 400V DC, and Vc may be IV DC. In some alternative embodiments, the first-stage power supply unit adjusts the voltage by way of step-down and the second-stage power supply unit performs step-down at a fixed ratio. For example, the first-stage power supply unit adopts a Buck circuit, and the second-stage power supply unit adopts an LLC circuit, wherein Va may be 48V DC or 400V DC, Vb may be 36V DC, and Vc may be IV DC.

Figure 36A:
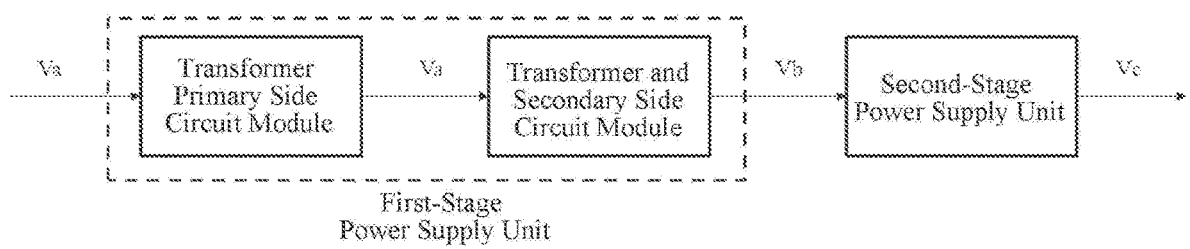
FIG. 36A is a schematic diagram of voltage variation of another power supply module according to some embodiments of the present invention.

FIG. 36a shows that the first-stage power supply unit adopts a transformer to perform step-down at a fixed ratio, and in some applications, a primary side and a secondary side of the transformer can also be separated, which helps to form a smaller front-stage primary side circuit module, a front-stage transformer and a secondary side circuit module. Furthermore, it is conducive to the flexible arrangement of the power supply module on the second carrier board or the first carrier board while a rear-stage performing step-down and voltage regulation. For example, the first-stage power supply unit adopts an LLC module and the second-stage power supply unit adopts a Buck circuit, wherein Va may be 48V DC or 400V DC, Vb may be 5V DC, and Vc may be IV DC.

Figure 36B:
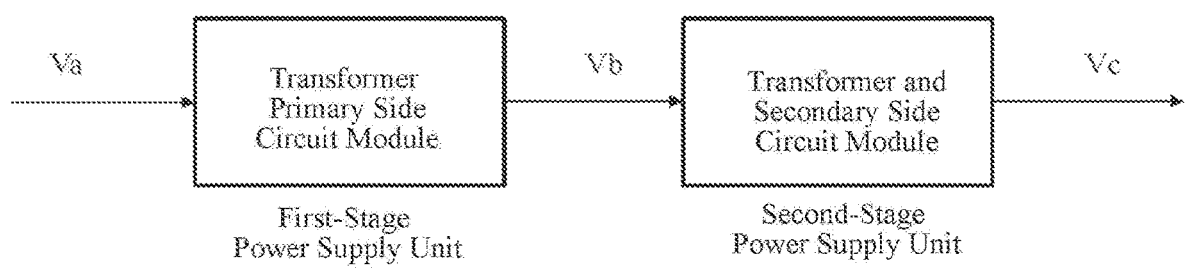
FIG. 36B is a schematic diagram of voltage variation of yet another power supply module according to some embodiments of the present invention.
Figure 36C:
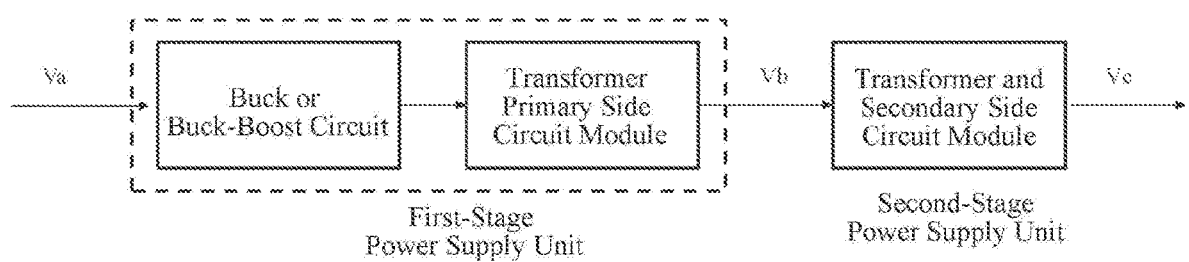
FIG. 36C is a schematic diagram of voltage variation of yet another power supply module according to some embodiments of the present invention.
Figure 36D:
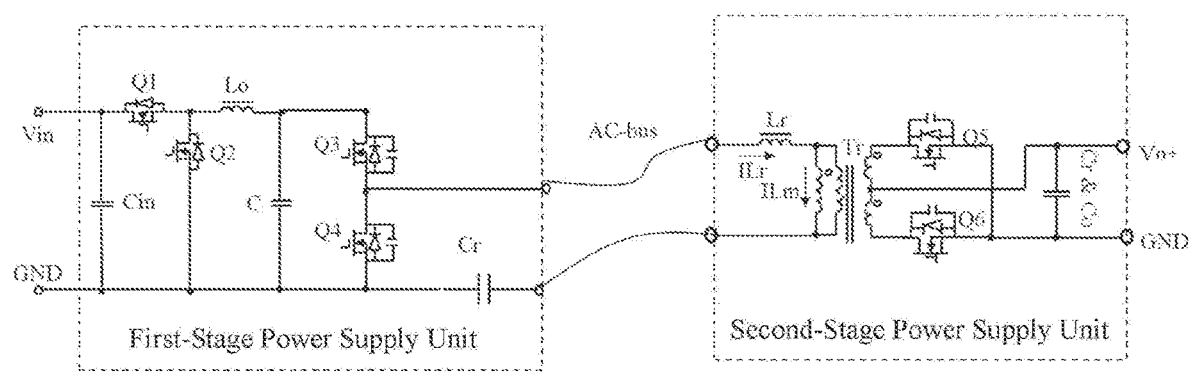
FIG. 36D is a circuit diagram of a power supply module according to some embodiments of the present invention.

When the first-stage power supply unit adopts a Buck circuit or a Buck-Boost circuit, and the second-stage power supply unit adopts a fixed-ratio power conversion circuit, such as an LLC circuit, the first-stage power supply unit and the second-stage power supply unit are connected by a direct current (DC) bus. FIGS. 36B to 36D show embodiments connected by an alternating current (AC) bus. In the foregoing first to twelfth embodiments, a two-stage power supply architecture illustrated in FIG. 36B may also be adopted. The first-stage power supply unit 3 may adopt a circuit capable of generating an alternating current wave (for example a square wave), such as a transformer primary side circuit, or a primary side circuit of LLC, the second-stage power supply unit 4 may adopt a transformer and an output rectifier circuit, wherein Vb is AC. For another example, as shown in FIG. 36C, a voltage adjustment circuit, such as a Buck circuit or a Buck-Boost circuit, may also be added in the first-stage power supply unit 3 on the basis of the arrangement in FIG. 36B. As shown in FIG. 36C, the first-stage power supply unit includes a Buck circuit or a Buck-Boost circuit and a transformer primary side circuit (that is, an alternating current wave generation circuit, for example a square wave generation circuit), wherein Vb is AC. FIG. 36D illustrates a 2-stage power supply architecture scheme based on the arrangement shown in FIG. 36C. The Buck circuit and a half-bridge LLC circuit are taken as examples. Of course, the primary side of the half-bridge LLC circuit can also be used. The first-stage power supply unit includes a Buck circuit composed of Q1 and Q2, and a primary side alternating current wave generation circuit (for example a square wave generation circuit) composed of Q3 and Q4. The second-stage power supply unit includes a transformer and an output rectifier circuit composed of Q5 and Q6. The two-stage power supply units are connected by an AC bus. The current fluctuation in the AC bus is large, however, in the solution of the present invention, the second carrier board 2 is used to transmit the AC-bus, which not only improves efficiency, but also effectively avoids the interference caused by the transmission of large fluctuation current on the first carrier board 1, thereby the interference to the signal of the integrated circuit chip 5 can be effectively reduced.

Figure 37:
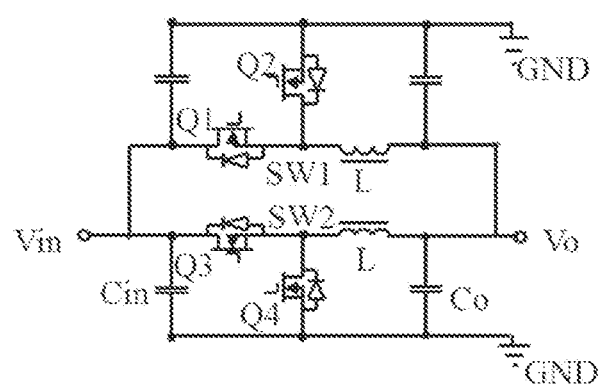
FIG. 37 is a circuit diagram of a Buck circuit.
Figure 38:
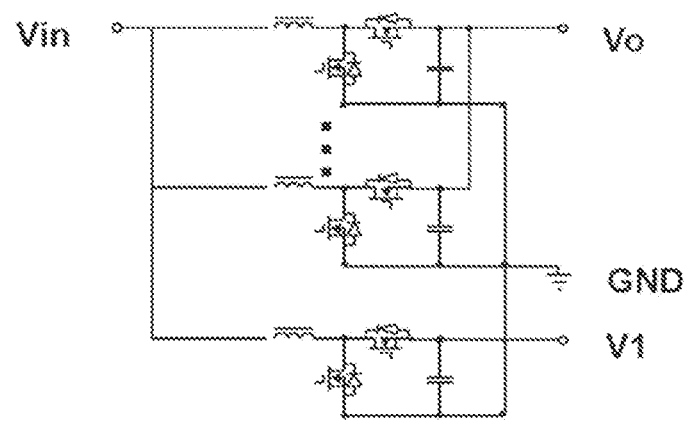
FIG. 38 is a circuit diagram of a Boost circuit.
Figure 39:
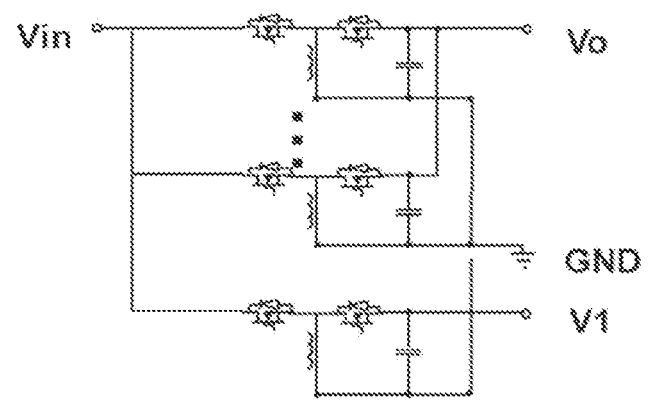
FIG. 39 is a circuit diagram of a Buck/Boost circuit.
Figure 40:
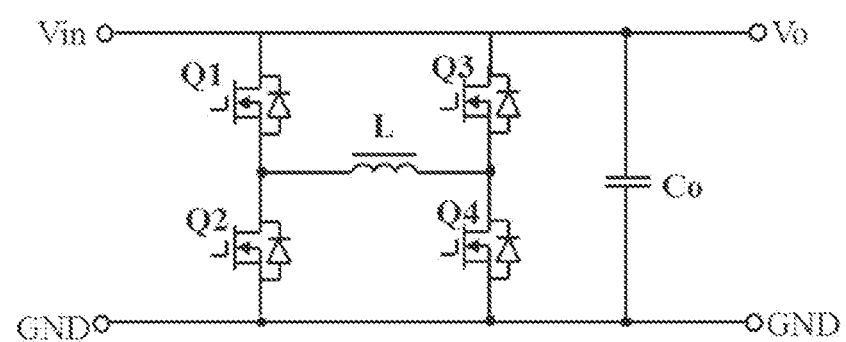
FIG. 40 is a circuit diagram of a Buck/Boost circuit having four switches.
Figure 41:
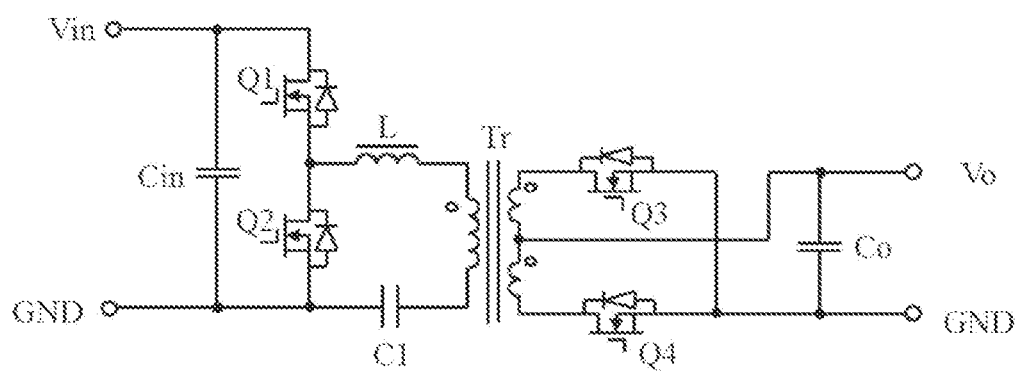
FIG. 41 is a circuit diagram of an LLC circuit.
Figure 42:
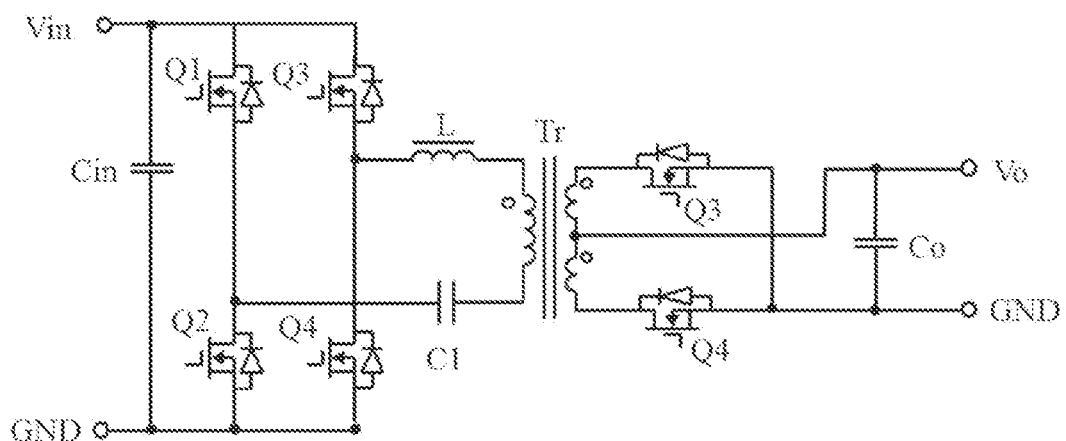
FIG. 42 is a circuit diagram of a full-bridge LLC circuit.
Figure 43:
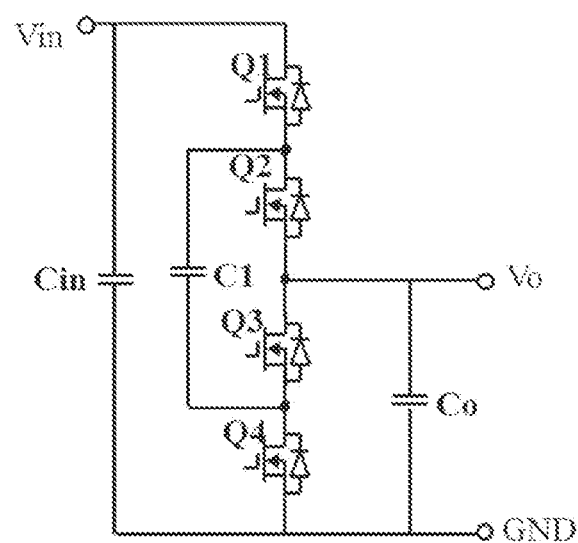
FIG. 43 is a circuit diagram of a switched capacitor circuit.

Any circuit in FIGS. 37 to 43 can be applied to the power supply module of the present invention. Of course, the present invention is not limited to these circuits, and other suitable circuits can also be applied. FIG. 37 is a Buck circuit. FIG. 38 is a Boost circuit. FIG. 39 is a Buck/Boost circuit. FIG. 40 is a Buck/Boost circuit with four switches. FIG. 41 is an LLC circuit. FIG. 42 is a full-bridge LLC circuit. FIG. 43 is a switching capacitor circuit. Among them. Cin represents an input capacitor, Co represents an output capacitor. Vin represents a positive input terminal of the circuit, GND represents a negative input terminal of the circuit, Vo represents a positive output terminal of the circuit, SW1 represents a midpoint of a first half-bridge circuit, SW2 represents a midpoint of a second half-bridge circuit, V1 represents a positive output terminal of the half-bridge circuit with a different output voltage from Vo. The embodiments of the present invention can also be used in other circuit topologies, for example, other circuits include, but are not limited to a Cuk circuit or a Flyback circuit. It is possible to obtain similar performance and effect improvements by referencing to similar designs and analysis.

In summary, by adopting a power supply module and an integrated circuit chip assembly of the present invention, the power supply module is divided into two-stage power supply units, and the second-stage power supply unit that directly supplies power to the integrated circuit chip is at least partially located right under the integrated circuit chip. Therefore, the vertical power supply of the second-stage power supply unit to the integrated circuit chip is realized, and the occupation of trace space and surface space of the first carrier board is reduced.

As used in this application, the term "or" is intended to mean an inclusive "or" rather than an exclusive "or." That is, unless specified otherwise, or clear from context. "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

The present invention has been described by the above-mentioned related embodiments. However, the above-mentioned embodiments are only examples for implementing the present invention and do not limit the scope of the present invention. On the contrary, changes and modifications made without departing from the spirit and scope of the present invention belong to the patent protection scope of the present invention.

What is claimed is:

1. A power supply module, wherein, which is applied to an integrated circuit chip assembly, the integrated circuit chip assembly comprises an integrated circuit chip and a first carrier board, the integrated circuit chip is located at a first side of the first carrier board;
    the power supply module comprising:
    a second carrier board;
    a first-stage power supply unit; and
    a second-stage power supply unit, each of one or more power input terminals of the second-stage power supply unit is electrically connected with a corresponding one of one or more power output terminals of the first-stage power supply unit through the second carrier board, respectively,
    wherein, the second carrier board is configured to transmit power from the first-stage power supply unit to the second-stage power supply unit, and the second-stage power supply unit further supplies the power to the integrated circuit chip;
    wherein, each of one or more power output terminals of the second-stage power supply unit is electrically connected with a corresponding one of one or more power terminals of the integrated circuit chip, and a projection of the second-stage power supply unit on a first plane is at least partially located within a projection range of the integrated circuit chip on the first plane, the first plane is parallel to the first carrier board.

2. The power supply module according to claim 1, wherein a projection of the power output terminals of the second-stage power supply unit on the first plane and a projection of the power terminals of the integrated circuit chip on the first plane have an overlapping region, and the second-stage power supply unit is located at a side close to the power terminals of the integrated circuit chip.

3. The power supply module according to claim 2, wherein one or more signal terminals of the integrated circuit chip and the power terminals of the integrated circuit chip both are drawn out from a side facing toward the first carrier board, and the signal terminals of the integrated circuit chip are located at a periphery of the power terminals of the integrated circuit chip;
    the second carrier board is located at a second side of the first carrier board, and the second side of the first carrier board is set to be opposite to the first side of the first carrier board.

4. The power supply module according to claim 3, wherein the first-stage power supply unit is located at a side of the second carrier board facing away from the first carrier board, and the second-stage power supply unit is located at the side of the second carrier board facing away from the first carrier board.

5. The power supply module according to claim 4, wherein a plurality of power vias are provided in the second carrier board, and projections of the power output terminals of the second-stage power supply unit, the power vias in the second carrier board, and the power terminals of the integrated circuit chip on the first plane have an overlapping region.

6. The power supply module according to claim 4, wherein a plurality of power vias are provided in the second carrier board and one or more capacitors are buried between the power vias, and a positive end of each of the capacitors is electrically connected to a corresponding positive power output terminal of the second-stage power supply unit and a corresponding positive power terminal of the integrated circuit chip, and a negative end of each of the capacitors is electrically connected to a corresponding negative power output terminal of the second-stage power supply unit and a corresponding negative power terminal of the integrated circuit chip.

7. The power supply module according to claim 4, wherein one or more inductors are buried in the second carrier board, a winding of each of the inductors is perpendicular to the first plane; and one end of the winding is electrically connected to a corresponding power output terminal of the second-stage power supply unit, and the other end of the winding is electrically connected to a corresponding power terminal of the integrated circuit chip.

8. The power supply module according to claim 3, wherein the first-stage power supply unit is located between the second side of the first carrier board and the second carrier board, and the second-stage power supply unit is located between the second side of the first carrier board and the second carrier board.

9. The power module according to claim 3, wherein
the second carrier board comprises a first sub-carrier board, a second sub-carrier board, and a third sub-carrier board, and the second sub-carrier board is located between the first sub-carrier board and the third sub-carrier board, and the second sub-carrier board is electrically connected with the first sub-carrier board and the third sub-carrier board respectively,
the first-stage power supply unit is located at a side of the first sub-carrier board facing away from the first carrier board, and the second-stage power supply unit is located at a side of the third sub-carrier board facing away from the first carrier board;
or,
the second carrier board comprises a first sub-carrier board and a second sub-carrier board, and the first sub-carrier board is electrically connected with the second sub-carrier board,
the first-stage power supply unit is located between the second side of the first carrier hoard and the first sub-carrier board, and the second-stage power supply unit is located at a side of the second sub-carrier board facing away from the first carrier board.

10. The power supply module according to claim 3, wherein the second carrier board, the first-stage power supply unit and the second-stage power supply unit form an integrated power supply module and the integrated power supply module is located at the second side of the first carrier board.

11. The power supply module according to claim 3, wherein an isolation structure is provided between the second carrier board and the first carrier board, and a projection of the isolation structure on the first plane covers a projection of the signal terminals of the integrated circuit chip on the first plane;
the isolation structure is an insulating layer, a shielding layer or a recessed area provided on the second carrier board.

12. The power supply module according to claim 3, wherein the first carrier board is provided with an opening and the second-stage power supply unit is electrically connected with the integrated circuit chip through the opening of the first carrier board;
the first-stage power supply unit is located at a side of the second carrier board facing away from the first carrier board, and a projection of the first-stage power supply unit on the first plane and a projection of second-stage power supply unit on the first plane have an overlapping region.

13. The power supply module according to claim 1, wherein there are a plurality of first-stage power supply units in the power supply module and there are a plurality of second-stage power supply units in the power supply module, wherein the plurality of second-stage power supply units are connected in parallel;
a plurality of projections of the plurality of first-stage power supply units on the first plane are located on at least two sides of a whole projection of the plurality of second-stage power supply units on the first plane, respectively;
a projection of the plurality of first-stage power supply units on the first plane is at least partially located outside of the projection range of the integrated circuit chip on the first plane.

14. The power supply module according to claim 1, wherein there is no overlapping region between the projection of the second-stage power supply unit on the first plane and a projection of the second carrier board on the first plane.

15. The power supply module according to claim 1, wherein one or more signal terminals of the integrated circuit chip are drawn out from a side facing toward the first carrier board, and the power terminals of the integrated circuit chip are drawn out from a side facing away from the first carrier board;
the second carrier board is located at a side of the integrated circuit chip facing away from the first carrier board, and the second-stage power supply unit is located at a side of the integrated circuit chip facing away from the first carrier board.

16. The power supply module according to claim 15, wherein
the second-stage power supply unit is located between the integrated circuit chip and the second carrier board, the first-stage power supply unit is located between the first side of the first carrier board and the second carrier board, or the first-stage power supply unit is located at a side of the second carrier board facing away from the first carrier board;
or,
the second-stage power supply unit is located at a side of the second carrier board facing away from the integrated circuit chip, the first-stage power supply unit is located at a side of the second carrier board facing away from the first carrier board, or the first-stage power supply unit is located between the first side of the first carrier board and the second carrier board.

17. The power supply module according to claim 15, wherein
the integrated circuit chip comprises a bare chip, an insulating packaging material, and a packaging substrate, the bare chip is buried in the insulating packaging material, and the packaging substrate is located between the insulating packaging material and the first carrier board, the signal terminals of the integrated circuit chip are drawn out from a side of the packaging substrate facing toward the first carrier board, and the power terminals of the integrated circuit chip are drawn out from a side of the insulating packaging material facing away from the first carrier board;
or,
the integrated circuit chip comprises a bare chip and a package substrate, and the package substrate is located between the bare chip and the first carrier board, the signal terminals of the integrated circuit chip are drawn out from a side of the packaging substrate facing toward the first carrier board, and the power terminals of the integrated circuit chip are drawn out from a side of the packaging substrate facing away from the first carrier board.

18. The power supply module according to claim 1, wherein the power supply module further comprises a heat sink and the heat sink is fixed to the second carrier board by a fastener.

19. The power supply module according to claim 1, wherein signal traces of the first-stage power supply unit are electrically connected with signal traces of the first carrier board;

the power input terminals of the first-stage power supply unit are electrically connected to the first carrier board;

or, the power supply module further comprises a connecting member, the connecting member is located at the second carrier board or the first-stage power supply unit, and the connecting member is electrically connected with the power input terminals of the first-stage power supply unit.

20. The power supply module according to claim 1, wherein the first-stage power supply unit and the second-stage power supply unit are electrically connected via an alternating current bus, wherein the first-stage power supply unit comprises an alternating current wave generation circuit, or the first-stage power supply unit comprises an alternating current wave generation circuit, and a Buck circuit or a Buck-Boost circuit connected in series with the alternating current wave generation circuit;

the second-stage power supply unit comprises a transformer and a rectifier circuit.

21. The power supply module according to claim 1, wherein the integrated circuit chip comprises a bare chip and a package substrate, the package substrate is located between the bare chip and the first carrier board; one or more capacitors are buried in the package substrate, one end of each capacitor is electrically connected with a corresponding positive power terminal of the integrated circuit chip, and the other end of the capacitor is electrically connected with a corresponding negative power terminal of the integrated circuit chip.

22. An electronic device, wherein comprising an integrated circuit chip assembly, and the power supply module according to claim 1;

wherein the integrated circuit chip assembly comprises an integrated circuit chip and a first carrier board, and the integrated circuit chip is located at the first side of the first carrier board.

* * * * *